United States Patent
Cha

(10) Patent No.: US 12,087,748 B2
(45) Date of Patent: Sep. 10, 2024

(54) DISPLAY DEVICE AND MANUFACTURING METHOD THEREOF

(71) Applicant: Samsung Display Co., LTD., Yongin-si (KR)

(72) Inventor: Jong Hwan Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 234 days.

(21) Appl. No.: 17/523,635

(22) Filed: Nov. 10, 2021

(65) Prior Publication Data

US 2022/0199599 A1 Jun. 23, 2022

(30) Foreign Application Priority Data

Dec. 23, 2020 (KR) .................. 10-2020-0182616

(51) Int. Cl.
*H01L 25/16* (2023.01)
*H01L 23/00* (2006.01)
(Continued)

(52) U.S. Cl.
CPC ............ *H01L 25/167* (2013.01); *H01L 24/03* (2013.01); *H01L 24/05* (2013.01);
(Continued)

(58) Field of Classification Search
CPC ... H01L 25/0753; H01L 25/167; H01L 24/03; H01L 24/05; H01L 27/1259; H01L 33/42; H01L 2224/03622; H01L 2224/05018; H01L 2224/05076; H01L 2224/05084; H01L 2224/05166; H01L 2224/05186; H01L 2224/05558; H01L 2224/05573;
(Continued)

(56) References Cited

U.S. PATENT DOCUMENTS 10,658,605 B2 5/2020 Lee et al.
2009/0128023 A1* 5/2009 Kwak .................. H10K 59/122
313/504

(Continued)

FOREIGN PATENT DOCUMENTS

CN 110783443 A 2/2020
KR 10-2019-0029831 A 3/2019
KR 10-2020-0088951 A 7/2020

OTHER PUBLICATIONS

Extended European Search Report, issued in corresponding Application No. EP 21216676.3 dated Jun. 10, 2022, 9 pages.

*Primary Examiner* — Thanh T Nguyen
(74) *Attorney, Agent, or Firm* — Lewis Roca Rothgerber Christie LLP

(57) ABSTRACT

A display device having a pad area and a display area is provided. The display device includes: a substrate; a pad structure on the substrate in the pad area; and a display element part on the substrate in the display area. The pad structure includes a first pad pattern, a second pad pattern on the first pad pattern, and a third pad pattern on the second pad pattern, and the display element part includes a light emitting element configured to emit light in a display direction. The second pad pattern has a first area and a second area, the second pad pattern and the third pad pattern do not contact each other in the first area, and the second pad pattern and the third pad pattern contact each other in the second area.

12 Claims, 37 Drawing Sheets

(51) Int. Cl.
*H01L 27/12* (2006.01)
*H01L 33/42* (2010.01)

(52) U.S. Cl.
CPC .......... *H01L 27/1259* (2013.01); *H01L 33/42* (2013.01); *H01L 2224/03622* (2013.01); *H01L 2224/05018* (2013.01); *H01L 2224/05076* (2013.01); *H01L 2224/05084* (2013.01); *H01L 2224/05166* (2013.01); *H01L 2224/05186* (2013.01); *H01L 2224/05558* (2013.01); *H01L 2224/05573* (2013.01); *H01L 2224/05686* (2013.01); *H01L 2933/0016* (2013.01)

(58) Field of Classification Search
CPC ... H01L 2224/05686; H01L 2933/0016; H01L 33/60; H01L 33/62; H01L 2933/0066; H01L 27/1214; H01S 5/0421; H01S 5/042; G09F 9/33
See application file for complete search history.

(56) References Cited

U.S. PATENT DOCUMENTS

2018/0061895 A1    3/2018  Kim et al.
2018/0174952 A1*   6/2018  Kim .................. H01L 23/49811
2021/0134877 A1*   5/2021  Kim ...................... H01L 27/156

\* cited by examiner

DISPLAY DEVICE AND MANUFACTURING METHOD THEREOF

CROSS-REFERENCE TO RELATED APPLICATION

This application claims priority to and the benefit of Korean patent application 10-2020-0182616, filed on Dec. 23, 2020 in the Korean Intellectual Property Office, the entire disclosure of which is incorporated herein by reference.

BACKGROUND

1. Field

Aspects of embodiments of the present disclosure relate to a display device and a manufacturing method thereof.

2. Related Art

Recently, as interest in information displays has increased, research and development of display devices have been continuously conducted.

SUMMARY

Embodiments of the present disclosure provide a display device having improved electrical reliability and reduced (or minimized) distortion of an electrical signal and a manufacturing method the display device.

In accordance with an embodiment of the present disclosure, a display device has a pad area and a display area, and the display device includes: a substrate; a pad structure on the substrate in the pad area, the pad structure including a first pad pattern, a second pad pattern on the first pad pattern, and a third pad pattern on the second pad pattern; and a display element part on the substrate in the display area, the display element part including a light emitting element configured to emit light in a display direction. The second pad pattern has a first area and a second area, the second pad pattern and the third pad pattern do not contact each other in the first area, and the second pad pattern and the third pad pattern contact each other in the second area.

The display element part may include a bank pattern having a shape protruding in the display direction and an arranged electrode on the bank pattern. The arranged electrode may be in the display area and may not be in the pad area.

The arranged electrode may include aluminum (Al).

The pad structure may further include a fourth pad pattern on the second pad pattern in the first area. The second pad pattern, the third pad pattern, and the fourth pad pattern may overlap each other in the first area, and the second pad pattern and the third pad pattern may overlap each other in the second area.

The pad structure may further include a cavity on the second pad pattern in the first area.

The display element part may further include a contact electrode electrically connected to the light emitting element. The contact electrode and the third pad pattern may include the same material.

In accordance with another embodiment of the present disclosure, a method of manufacturing a display device having a pad area and a display area is provided. The method includes: preparing a substrate; forming a first pad pattern on the substrate in the pad area; forming a second pad pattern on the first pad pattern; forming a third pad pattern on the second pad pattern; providing a protective layer to cover the third pad pattern; removing at least a portion of the protective layer such that at least a portion of the third pad pattern is exposed; forming a bank pattern having a shape protruding in a display direction on the protective layer in the display area; forming a first base electrode to cover the third pad pattern in the pad area and to cover the bank pattern in the display area; removing at least a portion of the first base electrode such that the first base electrode contacting the third pad pattern is removed; forming a fourth pad pattern on the third pad pattern; and arranging a light emitting element configured to emit light in the display direction.

In the removing of the at least the portion of the first base electrode, an etching process may be performed on the first base electrode. The second pad pattern may be an etch stop layer for the first pad pattern while the etching process is performed.

The removing of at least the portion of the first base electrode may include: removing the third pad pattern overlapping the protective layer after the removing of the at least the portion of the protective layer; and providing a arranged electrode on the bank pattern.

The method may further include forming a contact electrode electrically connected to the light emitting element. The contact electrode and the third pattern may be concurrently formed.

In accordance with another embodiment of the present disclosure, there is provided a display device having a pad area and a display area, the display device includes: a substrate; a pad structure on the substrate in the pad area, the pad structure including a first pad pattern, a second pad pattern on the first pad pattern, and a third pad pattern on the second pad pattern; and a display element part on the substrate in the display area, the display element part including a first arranged electrode, a second arranged electrode on the first arranged electrode, and a light emitting element. The third pad pattern includes the same material as the first arranged electrode.

The display device may further include: an insulating layer on the second arranged electrode and a contact electrode on the insulating layer. The contact electrode may be electrically connected to the light emitting element. The insulating layer may have a contact part not overlapping the second arranged electrode when viewed on a plane. The contact electrode may be connected to the first arranged electrode through the contact part.

The first arranged electrode and the second arranged electrode may include different materials.

Each of the first pad pattern, the second pad pattern, and the third pad pattern may include a material different from that of the second arranged electrode.

The third pad pattern and the contact electrode may include the same material.

The display element part may further include a bank having a shape protruding along a display direction of the light emitting element. At least a portion of each of the first arranged electrode and the second arranged electrode may be on the bank.

In accordance with another embodiment of the present disclosure, the a method of manufacturing a display device having a pad area and a display area is provided. The method includes: preparing a substrate; forming a first pad pattern on the substrate in the first pad area and forming a second pad pattern on the first pad pattern; arranging a first base electrode in the pad area and the display area; arranging a second base electrode on the first base electrode; performing a first etching process of removing at least a portion of the first base electrode and at least a first portion of the second base electrode; and performing a second etching process of removing at least a second portion of the second base electrode. The performing of the first etching process includes providing a third pad pattern on the second pad pattern and providing a first arranged electrode in the display area, and the performing of the second etching process includes removing the at least the second portion of the second base electrode such that the second base electrode arranged in the pad area is not electrically connected to the second pad pattern and a second arranged electrode is provided in the display area.

The method may further include: arranging a light emitting element in the display area; and forming a contact electrode electrically connected to the light emitting element on the second arranged electrode. The forming of the contact electrode may include forming the contact electrode to contact the first arranged electrode.

The method may further include: forming a first photoresist layer on the second base electrode in the pad area such that at least a portion of the first photoresist layer overlaps the second pad pattern; and forming a second photoresist layer on the second base electrode in the display area. The display area may have a (2-1)th area and a (2-2)th area. The second photoresist layer may include a (2-1)th photoresist layer in the (2-1)th area having a (2-1)th thickness and a (2-2)th photoresist layer in the (2-2)th area having a (2-2)th thickness. The first photoresist layer may have a first thickness. The (2-1)th thickness may be greater than the first thickness and the (2-2)th thickness.

The first arranged electrode may be concurrently formed with the third pad pattern and may be arranged in the (2-1)th area and the (2-2)th area. The second arranged electrode may be arranged in the (2-2)th area.

DETAILED DESCRIPTION

Figure 1:
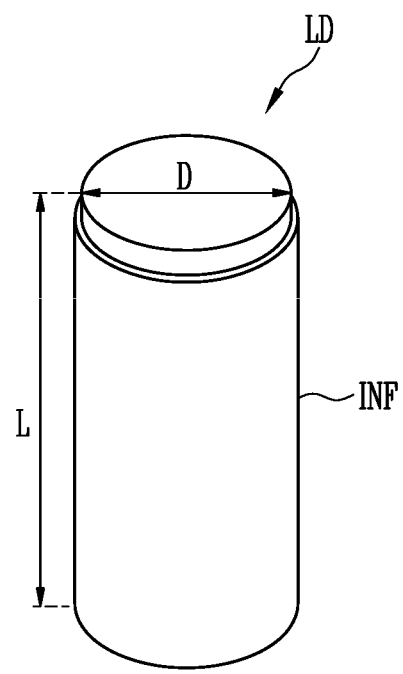
FIGS. 1 and 2 are perspective and sectional views, respectively, illustrating a light emitting element in accordance with an embodiment of the present disclosure.

Embodiments of the present disclosure will now be described more fully hereinafter with reference to the accompanying drawings. The present disclosure, however, may be embodied in different forms and should not be construed as limited to the embodiments set forth herein. Rather, these embodiments are provided so that this disclosure will be thorough and complete and will fully convey the scope of the present disclosure to those skilled in the art. In more detail, embodiments disclosed in the present specification are provided only for illustrative purposes and for full understanding of the scope of the present disclosure by those skilled in the art. However, the present disclosure is not limited to the embodiments, and it should be understood that the present disclosure includes modification examples or change examples without departing from the spirit and scope of the present disclosure.

In the figures, dimensions may be exaggerated for clarity of illustration. Like reference numerals refer to like elements throughout. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. It will be similarly understood that when an element is referred to as being "between" two elements, it can be the only element between the two elements, or one or more intervening elements may also be present.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of embodiment(s).

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular embodiments of the present disclosure and is not intended to be limiting of the described embodiments. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

The terms used in the specification are general terms currently widely used in consideration of the functions in the present disclosure, but they may depend on the intentions of those skilled in the art, practice, the appearance of new technologies, etc. In addition, specific cases use the terms selected arbitrarily by the applicant and in these cases, their meaning will be described when describing corresponding disclosures. Thus, it should be noted that the terms used in the specification should be construed on the basis of their actual meanings and contents through the specification, not just names thereof.

In the present specification, when it is determined that a detailed description of a known configuration or function related to the present disclosure may obscure the gist of the present disclosure, a detailed description thereof may be omitted.

The present disclosure generally relates to a display device and a manufacturing method thereof. Hereinafter, a display device and a manufacturing method thereof in accordance with embodiments of the present disclosure will be described with reference to FIGS. 1 to 37.

Figure 2:
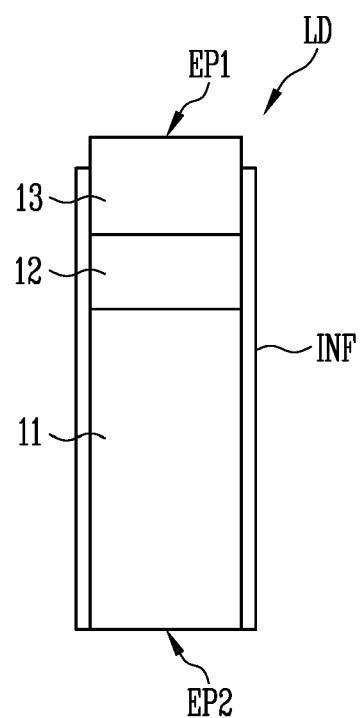

A light emitting element LD included in a display device in accordance with an embodiment of the present disclosure is illustrated in FIGS. 1 and 2. FIGS. 1 and 2 are perspective and sectional views illustrating a light emitting element in accordance with an embodiment of the present disclosure. Although a pillar-shaped light emitting element LD is illustrated in FIGS. 1 and 2, the kind and/or shape of the light emitting element LD are/is not limited thereto.

Referring to FIGS. 1 and 2, the light emitting element LD includes a first semiconductor layer 11, a second semiconductor layer 13, and an active layer 12 interposed between the first and second semiconductor layers 11 and 13. In an example, when assuming that an extending (or extension) direction of the light emitting element LD is a length L direction, the light emitting element LD may include the first semiconductor layer 11, the active layer 12, and the second semiconductor layer 13, which are sequentially stacked along the length L direction.

The light emitting element LD may have a pillar shape extending along one direction (e.g., along the length L direction). The light emitting element LD may have a first end portion EP1 and a second end portion EP2. One of the first and second semiconductor layers 11 and 13 may be adjacent to the first end portion EP1 of the light emitting element LD. The other of the first and second semiconductor layers 11 and 13 may be adjacent to the second end portion EP2 of the light emitting element LD.

In some embodiments, the light emitting element LD may be a light emitting element manufactured in a pillar shape through an etching process, etc. In this specification, the term "pillar shape" may include a rod-like shape or bar-like shape, which is long in the length L direction (e.g., has an aspect ratio greater than 1), such as a cylinder or a polyprism, and the shape of its section is not particularly limited. For example, a length L of the light emitting element LD may be greater than a diameter D (or a width of a cross-section) of the light emitting element LD.

The light emitting element LD may have a small size in a nanometer scale to a micrometer scale. In an example, the light emitting element LD may have a diameter D (or width) in a range of a nanometer scale to a micrometer scale and/or a length L in a range of a nanometer scale to a micrometer scale. However, the size of the light emitting element LD is not limited thereto. The size of the light emitting element LD may be variously changed according to design conditions of various types of devices (e.g., a display device and the like), which have a light emitting device using the light emitting element LD.

The first semiconductor layer 11 may be a first conductivity type semiconductor layer. For example, the first semiconductor layer 11 may include an N-type semiconductor layer. In an example, the first semiconductor layer 11 may include any one semiconductor material from among InAlGaN, GaN, AlGaN, InGaN, AlN, and InN and may include an N-type semiconductor layer doped with a first conductivity type dopant, such as Si, Ge or Sn. However, the first semiconductor layer 11 (e.g., the material constituting the first semiconductor layer 11) is not limited thereto. The first semiconductor layer 11 may be configured with (e.g., may include or may be formed of) various suitable materials.

The active layer 12 is formed on the first semiconductor layer 11 and may be formed having a single-quantum well structure or a multi-quantum well structure. The position of the active layer 12 may be variously changed according to a kind of the light emitting element LD.

A clad layer doped with a conductive dopant may be formed on the top and/or the bottom of the active layer 12. In an example, the clad layer may be an AlGaN layer or InAlGaN layer. In some embodiments, a material, such as AlGaN or AlInGaN, may be used to form the active layer 12. The active layer 12 may be configured with (e.g., may include or may be formed of) various suitable materials.

The second semiconductor layer 13 is formed on the active layer 12 and may include a semiconductor layer having a type different from that of the first semiconductor layer 11. For example, the second semiconductor layer 13 may include a P-type semiconductor layer. In an example, the second semiconductor layer 13 may include at least one semiconductor material from among InAlGaN, GaN, AlGaN, InGaN, AlN, and InN and may include a P-type semiconductor layer doped with a second conductivity type dopant, such as Mg. However, the second semiconductor layer 13 (e.g., the material constituting the second semiconductor layer 13) is not limited thereto. The second semiconductor layer 13 may be configured with (e.g., may include or may be formed of) various suitable materials.

When a voltage of a threshold voltage or more is applied to both ends (e.g., opposite ends) of the light emitting element LD, electron-hole pairs are combined in the active layer 12 of the light emitting element LD to emit light. The light emission of the light emitting element LD is controlled by using such a principle so that the light emitting element LD can be used as a light source for various light emitting devices, including a pixel of a display device.

The light emitting element LD may further include an insulative film INF provided on a surface thereof. The insulative film INF may be formed on the surface of the light emitting element LD to surround (or extend around) an outer circumferential surface of at least the active layer 12. The insulative film INF may further surround (or extend around a periphery of) one area of each of the first and second semiconductor layers 11 and 13. The insulative film INF may be formed as a single film or a double film (e.g., a double-layer film). However, the present disclosure is not limited thereto, and the insulative film INF may be configured with a plurality of films (e.g., may include a plurality of layers or films). In an example, the insulative film INF may include a first insulative film including a first material and a second insulative film including a second material different from the first material.

In some embodiments, the insulative film INF may expose both end portions EP1 and EP2 of the light emitting element LD. For example, the insulative film INF may expose one end of each of the first and second semiconductor layers 11 and 13 located at the first and second end portions EP1 and EP2 of the light emitting element LD. In another embodiment, the insulative film INF may expose a side portion of each of the first and second semiconductor layers 11 and 13 adjacent to the first and second end portions EP1 and EP2 of the light emitting element LD, which have different polarities.

In some embodiments, the insulative film INF may be configured as a single layer or a multi-layer structure (e.g., a double layer structure including aluminum oxide ($AlO_x$) and silicon oxide ($SiO_x$)), including at least one insulating material from among silicon oxide ($SiO_x$), silicon nitride ($SiN_x$), silicon oxynitride (SiON), aluminum oxide ($AlO_x$), and titanium oxide ($TiO_x$), but the present disclosure is not necessarily limited thereto. In some embodiments, the insulative film INF may be omitted.

The insulative film INF is provided to cover the surface of the light emitting element LD, such as the outer circumferential surface of the active layer 12, so that the active layer 12 can ensure the electrical stability of the light emitting element LD.

Also, when the insulative film INF is provided on the surface of the light emitting element LD, a surface defect in the light emitting element LD is mitigated (or minimized), thereby improving the lifetime and efficiency of the light emitting element LD. In addition, an unwanted short circuit can be substantially prevented from occurring between a plurality of light emitting elements LD even when the light emitting elements LD are disposed close to each other.

In an embodiment, the light emitting element LD may further include an additional component in addition to the first semiconductor layer 11, the active layer 12, the second semiconductor layer 13, and/or the insulative film surrounding the same. For example, the light emitting element LD may additionally include at least one phosphor layer, at least one active layer, at least one semiconductor layer, and/or at least one electrode layer, which are disposed at one ends of the first semiconductor layer 11, the active layer 12, and/or the second semiconductor layer 13. In an example, a contact electrode layer may be disposed at each of the first and second end portions EP1 and EP2 of the light emitting element LD.

A light emitting device including the above-described light emitting element LD may be used in various kinds of devices which use a light source, including a display device.

For example, a plurality of light emitting elements LD may be disposed in each pixel of a display panel and may be used as a light source of each pixel. However, the application field of the light emitting element LD is not limited to the above-described example. For example, the light emitting element LD may be used in other types of devices that use a light source, such as a lighting device.

Figure 3:
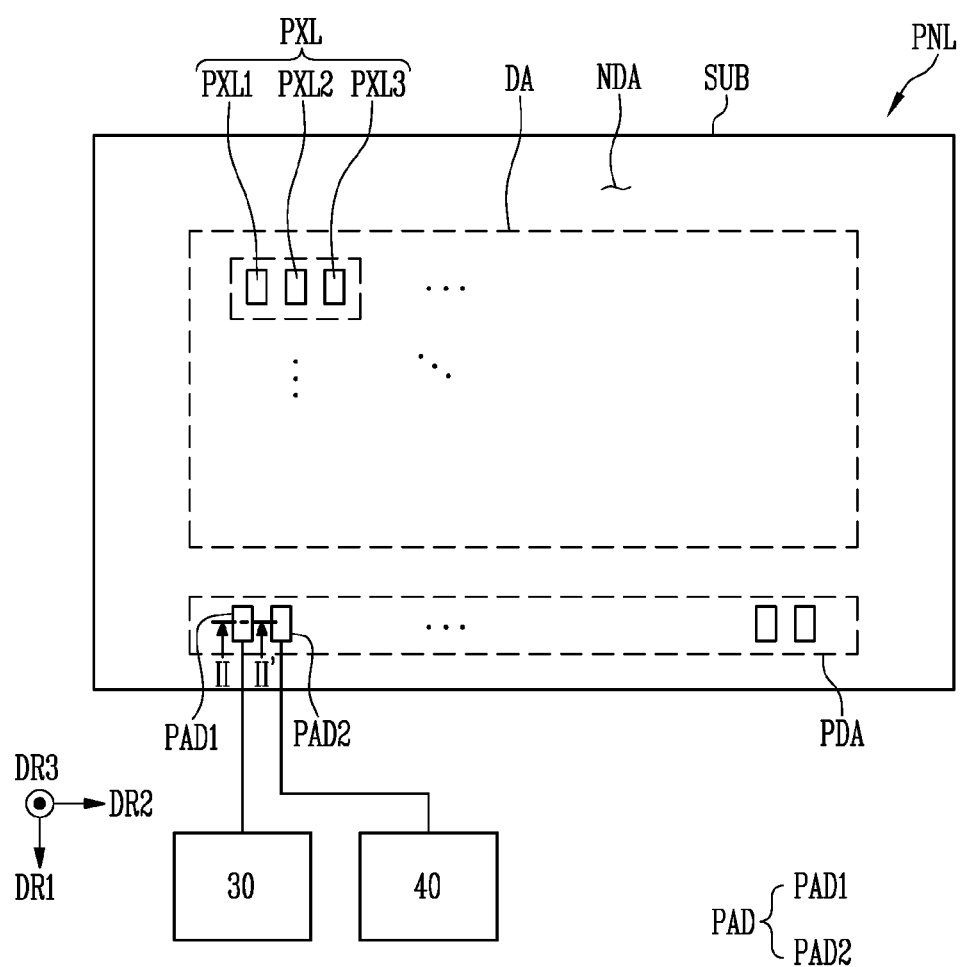
FIG. 3 is a plan view schematically illustrating a display device in accordance with an embodiment of the present disclosure.

FIG. 3 is a plan view schematically illustrating a display device in accordance with an embodiment of the present disclosure.

In FIG. 3, a display device, for example, a display panel PNL provided in the display device, will be illustrated as an example of an electronic device which can use the light emitting element LD as a light source. In FIG. 3, a structure of the display panel PNL will be schematically illustrated based on a display area DA.

Referring to FIG. 3, the display device in accordance with a embodiment of the present disclosure may include the display panel PNL, a scan driver 30, and a data driver 40.

The display panel PNL includes a substrate SUB as a base member, and the substrate SUB may be a rigid or flexible substrate or a film.

The display panel PNL and the substrate SUB for forming the same may have the display area DA for displaying an image and a non-display area NDA except (e.g., other than) the display area DA.

Pixels PXL may be arranged in the display area DA. The pixel PXL may include the light emitting element LD. The pixel PXL may emit light based on a signal provided from the scan driver 30 and/or a signal provided from the data driver 40.

The pixels PXL may be regularly arranged in the display area DA according to a stripe structure, a PenTile® structure (a registered trademark of Samsung Display Co., Ltd.) (e.g., a diamond structure), or the like. However, the arrangement structure of the pixels PXL is not limited thereto, and the pixels PXL may be arranged in the display area DA in various structures and/or by using various methods.

In some embodiments, two or more kinds of pixels PXL emitting light of different colors may be disposed in the display area DA. In an example, the pixel PXL may include a first pixel PXL1 emitting light of a first color, a second pixel PXL2 emitting light of a second color, and a third pixel PXL3 emitting light of a third color. At least one first pixel PXL1, a least one second pixel PXL2, and at least one third pixel PXL3, which are disposed adjacent to each other, may constitute one pixel unit PXL configured to emit lights of various colors. For example, each of the first to third pixels PXL1, PXL2, and PXL3 may be a sub-pixel emitting light of a different color. In some embodiments, the first pixel PXL1 may be a red pixel emitting red light, the second pixel PXL2 may be a green pixel emitting green light, and the third pixel PXL3 may be a blue pixel emitting blue light. However, the present disclosure is not limited thereto.

In an embodiment, the first pixel PXL1, the second pixel PXL2, and the third pixel PXL3 respectively have, as light sources, a light emitting element of the first color, a light emitting element of the second color, and a light emitting element of the third color, so that the light emitting elements can respectively emit lights of the first color, the second color, and the third color. In another embodiment, the first pixel PXL1, the second pixel PXL2, and the third pixel PXL3 have light emitting elements emitting light of the same color, and color conversion layers and/or color filters of different colors may be included to be disposed on the respective light emitting elements to respectively emit lights of the first color, the second color, and the third color.

However, the color, kind, and/or number of pixels PXL constituting each pixel unit are not particularly limited. That is, the color of light emitted by each pixel PXL may be variously changed.

The scan driver 30 may output a scan signal. The data driver 40 may output a data signal. Each of the scan driver 30 and the data driver 40 may be connected to a plurality of lines of the display panel PNL. The scan driver 30 and the data driver 40 may be located outside of (or external to) the display panel PNL. However, the present disclosure is not limited thereto. In some embodiments, at least one of the scan driver 30 and the data driver 40 may be located inside of (or internal to) the display panel PNL.

Various types of lines connected to the pixel PXL of the display area DA, a pad PAD, and/or a built-in circuit may be disposed in the non-display area NDA.

A pad area PDA may be disposed in the non-display area NDA. The pad area PDA may be located at one side of the display area DA. Although an embodiment in which the pad area PDA is disposed adjacent to the display area DA at a lower side of the display area DA is illustrated in FIG. 3, the present disclosure is not limited thereto.

The pad PAD may be disposed in the pad area PDA. In accordance with an embodiment, the pad PAD may be provided in plurality. In an example, the pad PAD may include a first pad PAD1 and a second pad PAD2. The first pad PAD1 may be a gate pad, and the second pad PAD2 may be a data pad. The first pad PAD1 may be connected to the scan driver 30. The scan signal provided from the scan driver 30 may be transferred to a scan line connected to the pixel PXL via the first pad PAD1. The second pad PAD2 may be connected to the data driver 40. The data signal provided from the data driver 40 may be transferred to a data line connected to the pixel PXL via the second pad PAD2. Hereinafter, for convenience of description, the pad PAD may be designated as a pad structure.

Hereinafter, the display device and the pad PAD in accordance with an embodiment of the present disclosure will be described with reference to FIGS. 4 to 7.

Figure 4:
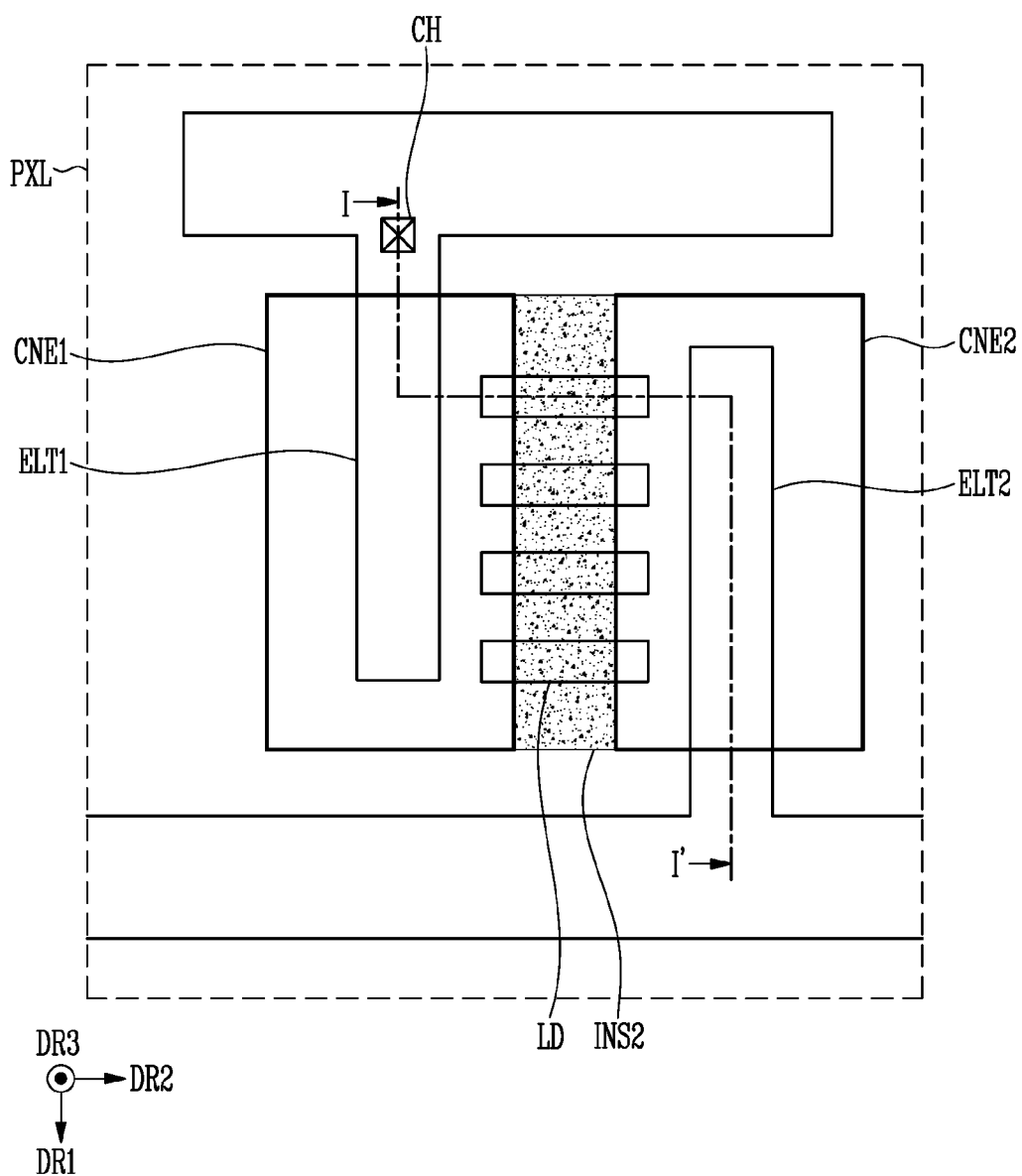
FIG. 4 is a top view schematically illustrating a pixel in accordance with an embodiment of the present disclosure.

FIG. 4 is a top view schematically illustrating a pixel in accordance with an embodiment of the present disclosure.

Referring to FIG. 4, the pixel PXL may include alignment electrodes, a light emitting element LD, a second insulating layer INS2, a first contact electrode CNE1, and a second contact electrode CNE2. The alignment electrodes may be a first electrode ELT1 and a second electrode ELT2.

The first electrode ELT1 and the second electrode ELT2 may have a shape extending in a first direction DR1. The first electrode ELT1 and the second electrode ELT2 may be spaced apart from each other to provide an area therebetween at where the light emitting element LD can be arranged.

The light emitting element LD may be arranged between the first electrode ELT1 and the second electrode ELT2. In an example, the light emitting element LD may be connected to the first electrode ELT1 and the second electrode ELT2 in a parallel structure, but the present disclosure is not limited thereto. The light emitting element LD may be electrically connected to the first contact electrode CNE1 and the second electrode CNE2. The light emitting element LD may be electrically connected to the first electrode ELT1 through the first contact electrode CNE1. The light emitting element LD may be electrically connected to the second electrode ELT2 through the second contact electrode CNE2.

The second insulating layer INS2 may be located on the light emitting element LD. At least a portion of the second insulating layer INS2 may be located between the first contact electrode CNE1 and the second contact electrode CNE2.

The arrangement relationship of the light emitting element LD and the electrode components connected thereto is not limited to the example described with reference to FIG. 4, and arrangement relationships in accordance with various modifiable embodiments may be implemented.

Figure 5:
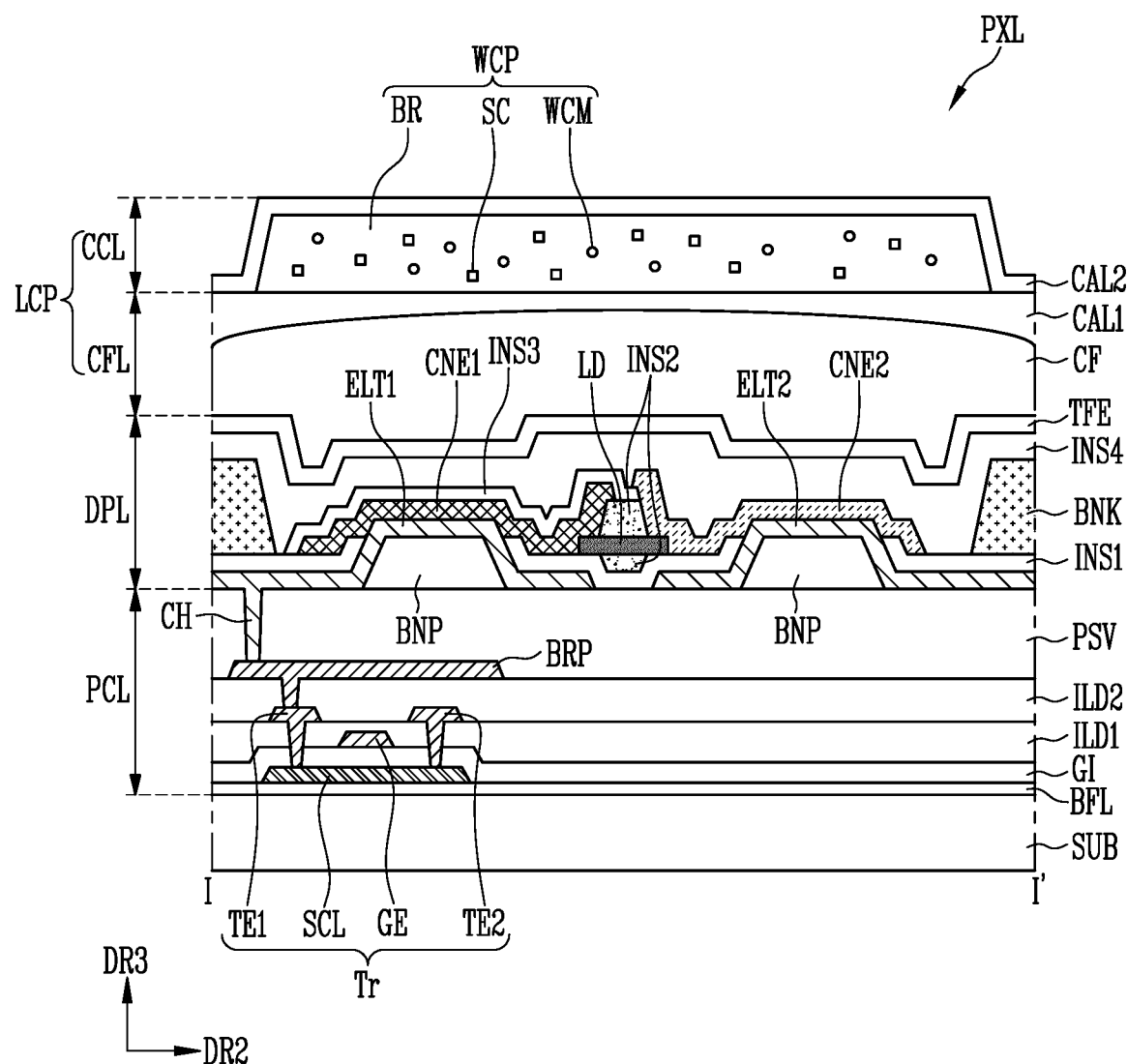
FIG. 5 is a sectional view taken along the line I-I' shown in FIG. 4.

FIG. 5 is a sectional view taken along the line I-I' shown in FIG. 4.

Referring to FIG. 5, the pixel PXL may include the substrate SUB, a pixel circuit part PCL, a display element part DPL, a light control part LCP. The light control part LCP may include a color filter layer CFL and a color conversion layer CCL.

The substrate SUB may be a rigid or flexible substrate. In an example, the substrate SUB may include a rigid material or a flexible material. However, the material of the substrate SUB is not limited to any specific example.

The pixel circuit part PCL may be located on the substrate SUB. The pixel circuit part PCL may include a buffer layer BFL, a transistor Tr, a gate insulating layer GI, a first interlayer insulating layer ILD1, a second interlayer insulating layer ILD2, a bridge pattern BRP, a contact opening (e.g., a contact hole) CH, and a protective layer PSV.

The buffer layer BFL may be located on the substrate SUB. The buffer layer BFL may prevent or substantially prevent an impurity from being diffused from the outside. The buffer layer BFL may include at least one of silicon nitride ($SiN_x$), silicon oxide ($SiO_x$), silicon oxynitride ($SiO_xN_y$), and metal oxide, such as aluminum oxide ($AlO_x$).

The transistor Tr may be a thin film transistor. The transistor Tr may be a driving transistor. The transistor Tr may include a semiconductor layer SCL, a gate electrode GE, a first transistor electrode TE1, and a second transistor electrode TE2.

The semiconductor layer SCL may be located on the buffer layer BFL. The semiconductor layer SCL may include at least one of poly-silicon, amorphous silicon, and an oxide semiconductor.

The semiconductor layer SCL may include a first contact region contacting the first transistor electrode TE1 and a second contact region contacting the second transistor electrode TE2.

The first contact region and the second contact region may correspond to a semiconductor pattern doped with an impurity. A region between the first contact region and the second contact region may be a channel region. The channel region may correspond to an intrinsic semiconductor pattern undoped with the impurity.

The gate insulating layer GI may be provided over the semiconductor layer SCL. The gate insulating layer GI may include an inorganic material. In an example, the gate insulating layer GI may include at least one of silicon nitride ($SiN_x$), silicon oxide ($SiO_x$), silicon oxynitride ($SiO_xN_y$), and aluminum oxide ($AlO_x$). In some embodiments, the gate insulating layer GI may include an organic material.

The gate electrode GE may be located on the gate insulating layer GI. A position of the gate electrode GE may correspond to that of the channel region of the semiconductor layer SCL. For example, the gate electrode GE may be disposed on the channel region of the semiconductor layer SCL with the gate insulating layer GI interposed therebetween.

The first interlayer insulating layer ILD1 may be located over the gate electrode GE. Similar to the gate insulating layer GI, the first interlayer insulating layer ILD1 may include at least one of silicon nitride (SiN$_x$), silicon oxide (SiO$_x$), silicon oxynitride (SiO$_x$N$_y$), and aluminum oxide (AlO$_x$).

The first transistor electrode TE1 and the second transistor electrode TE2 may be located on the first interlayer insulating layer ILD1. The first transistor electrode TE1 may contact the first contact region of the semiconductor layer SCL by penetrating the gate insulating layer GI and the first interlayer insulating layer ILD1. The first transistor electrode TE1 may be electrically connected to the bridge electrode BRP. The second transistor electrode TE2 may contact the second contact region of the semiconductor layer SCL by penetrating the gate insulating layer GI and the first interlayer insulating layer ILD1. In an example, the first transistor electrode TE1 may be a source electrode, and the second transistor electrode TE2 may be a drain electrode.

The second interlayer insulating layer ILD2 may be located over the first transistor electrode TE1 and the second transistor TE2. Similar to the first interlayer insulating layer ILD1 and the gate insulating layer GI, the second interlayer insulating layer ILD2 may include an inorganic material. The inorganic material may include at least one of the materials exemplified as the material constituting the first interlayer insulating layer ILD1 and the gate insulating layer GI, for example, silicon nitride (SiN$_x$), silicon oxide (SiO$_x$), silicon oxynitride (SiO$_x$N$_y$), and aluminum oxide (AlO$_x$). In some embodiments, the second interlayer insulating layer ILD2 may include an organic material.

The bridge pattern BRP may be located on the second interlayer insulating layer ILD2. The bridge pattern BRP may be electrically connected to the first transistor electrode TE1. The bridge pattern BRP may include a conductive material.

The protective layer PSV may be located on the second interlayer insulating layer ILD2. The protective layer PSV may cover the bridge pattern BRP.

The protective layer PSV may include an organic insulating layer, an inorganic insulating layer, or the organic insulating layer disposed on the inorganic insulating layer. The protective layer PSV may have the contact opening CH electrically connected to one region of the first transistor electrode TE1.

The contact opening CH may be formed in the protective layer PSV. The bridge pattern BRP and the first electrode ELT1 may be electrically connected to each other through the contact opening CH in the protective layer PSV.

The display element part DPL may include a bank pattern BNP, the first electrode ELT1, the second electrode ELT2, a first insulating layer INS1, a bank BNK, the light emitting element LD, the second insulating layer INS2, the first contact electrode CNE1, the second electrode CNE2, a third insulating layer INS3, a fourth insulating layer INS4, and a thin film encapsulation layer TFE.

The bank pattern BNP may have a shape protruding in a display direction (e.g., a third direction DR3). When viewed on a plane, the bank pattern BNP may have a shape surrounding (or extending around) an area in which the light emitting element LD is arranged.

The first electrode ELT1 and the second electrode ELT2 may be arranged on the bank pattern BNP to reflect light emitted from the light emitting element LD in the third direction DR3.

The first electrode ELT1 and the second electrode ELT2 may act as a first reflective electrode of the light emitting element LD. According to an embodiment, the first reflective electrode may be referred to as a first arranged electrode. The first electrode ELT1 and the second electrode ELT2, which act as the first reflective electrode, are provided to improve the light efficiency of the light emitting element LD.

A portion of the first electrode ELT1 may be arranged on the protective layer PSV, and another portion of the first electrode ELT1 may be arranged on the bank pattern BNP. The first electrode ELT1 may be a path through which electrical information can be provided to the light emitting element LD from the transistor Tr through the contact opening CH.

A portion of the second electrode ELT2 may be arranged on the protective layer PSV, and another portion of the second electrode ELT2 may be arranged on the bank pattern BNP. The second electrode ELT2 may be a path through which electrical information can be provided to the light emitting element LD through a connection line. The first electrode ELT1 and the second electrode ELT2 may be arranged in the same layer.

In one embodiment, the first electrode ELT1 and the second electrode ELT2 may include a reflective material. The first electrode ELT1 and the second electrode ELT2 may include a material having a reflexibility of 90% or more. In an example, the first electrode ELT1 and the second electrode ELT2 may include aluminum or an alloy thereof.

The first insulating layer INS1 may be located on the protective layer PSV. Similar to the second interlayer insulating layer ILD2, the first insulating layer INS1 may include at least one of silicon nitride (SiN$_x$), silicon oxide (SiO$_x$), silicon oxynitride (SiO$_x$N$_y$), and aluminum oxide (AlO$_x$).

At least a portion of the first insulating layer INS1 may be disposed on the first electrode ELT1 and/or the second electrode ELT2 to stabilize electrical connection and to reduce external influence.

The bank BNK may be a structure defining an emission area of the pixel PXL. The emission area may be an area in which light is emitted from the light emitting element LD. For example, the bank BNK may be disposed at a boundary area between adjacent light emitting elements LD to surround (or extend around) the light emitting element LD of the pixel PXL.

The light emitting element LD may be located on the first insulating layer INS1 between the first electrode ELT1 and the second electrode ELT2. The light emitting element LD may be the light emitting element LD described above with reference to FIGS. 1 and 2.

The second insulating layer INS2 may be located on the light emitting element LD. The second insulating layer INS2 may be formed to cover a region corresponding to the active layer 12 of the light emitting element LD. The second insulating layer INS2 may include at least one of an organic material and an inorganic material.

In some embodiments, at least a portion of the second insulating layer INS2 may be located on a rear surface of the light emitting element LD. The second insulating layer INS2 formed on the rear surface of the light emitting element LD may fill an empty gap between the first insulating layer INS1 and the light emitting element LD in a process of forming the second insulating layer INS2 on the light emitting element LD.

At least a portion of each of the first contact electrode CNE1 and the second contact electrode CNE2 may be located on the first insulating layer INS1. The first contact electrode CNE1 may be electrically connected to the first electrode ELT1. The second contact electrode CNE2 may be electrically connected to the second electrode ELT2. In some embodiments, the first insulating layer INS1 may be arranged on the first electrode ELT1, and the first electrode ELT1 and the second contact electrode CNE1 may be electrically connected to each other through a first contact opening (e.g., a first contact hole) formed in the first insulating layer INS1. The first insulating layer INS1 may be arranged on the second electrode ELT2, and the second electrode ELT2 and the second contact electrode CNE2 may be electrically connected to each other through a second contact opening (e.g., a second contact hole) formed in the first insulating layer INS1.

The first contact electrode CNE1 and the second contact electrode CNE2 may include a transparent conductive material. In an example, the first contact electrode CNE1 and the second contact electrode CNE2 may include at least one conductive material, such as Indium Tin Oxide (ITO), Indium Zinc Oxide (IZO), and Indium Tin Zinc Oxide (ITZO).

An electrical signal provided through the first electrode ELT1 may be provided to the light emitting element LD through the first contact electrode CNE1, and an electrical signal provided through the second electrode ELT2 may be provided to the light emitting element LD through the second contact electrode CNE2. The light emitting element LD may emit light based on the provided electrical signals.

The third insulating layer INS3 may be located over the first contact electrode CNE1. The third insulating layer INS3 may include any one of an organic material and an inorganic material. At least a portion of the third insulating layer INS3 is located on the second insulating layer INS2 and may be located between the first contact electrode CNE1 and the second contact electrode CNE2. As described above, when the third insulating layer INS3 is formed between the first contact electrode CNE1 and the second contact electrode CNE2, electrical stability between one end portion and the other end portion of the light emitting element LD can be ensured. Accordingly, a short-circuit defect can be prevented or substantially prevented from occurring between the one end portion and the other end portion of the light emitting element LD.

The fourth insulating layer INS4 may be arranged over the bank BNK, the third insulating layer INS3, and the second contact electrode CNE2. The fourth insulating layer INS4 may include any one of an organic material and an inorganic material. The fourth insulating layer INS4 may protect the display element part DPL from external influence.

The thin film encapsulation layer TFE may be located on the fourth insulating layer INS4. The thin film encapsulation layer TFE may include any one of an organic material and an inorganic material. In some embodiments, the thin film encapsulation layer TFE may be omitted.

The light control part LCP may be located on the display element part DPL. Although an embodiment in which the color filter layer CFL is located on the display element part DPL and the color conversion layer CCL is located on the color filter layer CFL is illustrated in FIG. 5, the present disclosure is not limited thereto. For example, in some embodiments, the color conversion layer CCL may be located on the display element part DPL, and the color filter layer CFL may be located on the color conversion layer CCL.

The color filter layer CFL may include a color filter CF and a first capping layer CAL1. The color filter CF allows light having a specific wavelength to be selectively transmitted therethrough and may absorb light having a wavelength different from the specific wavelength. Light passing through the color filter CF may display one of three primary colors of red, green, and blue. However, a display color of light passing through the color filter CF is not limited to the primary colors, and the light passing through the color filter CF may display any one of cyan, magenta, yellow, and a white-based color.

The color conversion layer CCL may include a wavelength conversion pattern WCP and a second capping layer CAL2. The wavelength conversion pattern WCP may include a wavelength conversion material WCM, a base resin BR, and a scattering material SC. However, in some embodiments, the wavelength conversion pattern WCP may be omitted from the color conversion layer CCL. The color conversion layer CCL may include a light transmission pattern including the base resin BR and the scattering material SC and the second capping layer CAL2 over the light transmission pattern. Hereinafter, an embodiment in which the color conversion layer CCL includes the wavelength conversion pattern WCP will be primarily described.

The wavelength conversion material WCM may convert a peak wavelength of incident light. In an example, the wavelength conversion material WCM may convert blue light into red light having a wavelength in a range of about 610 nm to about 650 nm. As another example, the wavelength conversion material WCM may convert blue light into green light having a wavelength in a range of about 510 nm to about 550 nm.

The wavelength conversion material WCM may be a quantum dot (QD), a quantum rod, or a fluorescent substance.

The quantum dot may be a particle material that emits light having a specific wavelength while electrons are transferred from a conduction band to a valence band. The quantum dots may be semiconductor nanocrystalline materials. The quantum dots have a specific band gap depending on their composition and size and may emit light having an inherent band after absorbing light. Examples of the semiconductor nanocrystals of the quantum dots may include a Group IV based nanocrystal, a Group II-VI based compound nanocrystal, a Group III-V based compound nanocrystal, a Group IV-VI based compound nanocrystal, or a combination thereof.

The base resin BR may have high light transmittance and have excellent dispersion characteristic with respect to the wavelength conversion material WCM. For example, the base resin BR may include an organic material, such as epoxy-based resin, acryl-based resin, cardo-based resin, or imide-based resin.

The scattering material SC may have a refractive index different from that of the base resin BR and may form an optical interface with the base resin BR. The scattering material SC may be a light scattering particle. In an example, the scattering material SC may be a metal oxide particle or an organic particle.

Hereinafter, pads PAD included in the display device in accordance with embodiments of the present disclosure will be described with reference to FIGS. 6 and 7.

Figure 6:
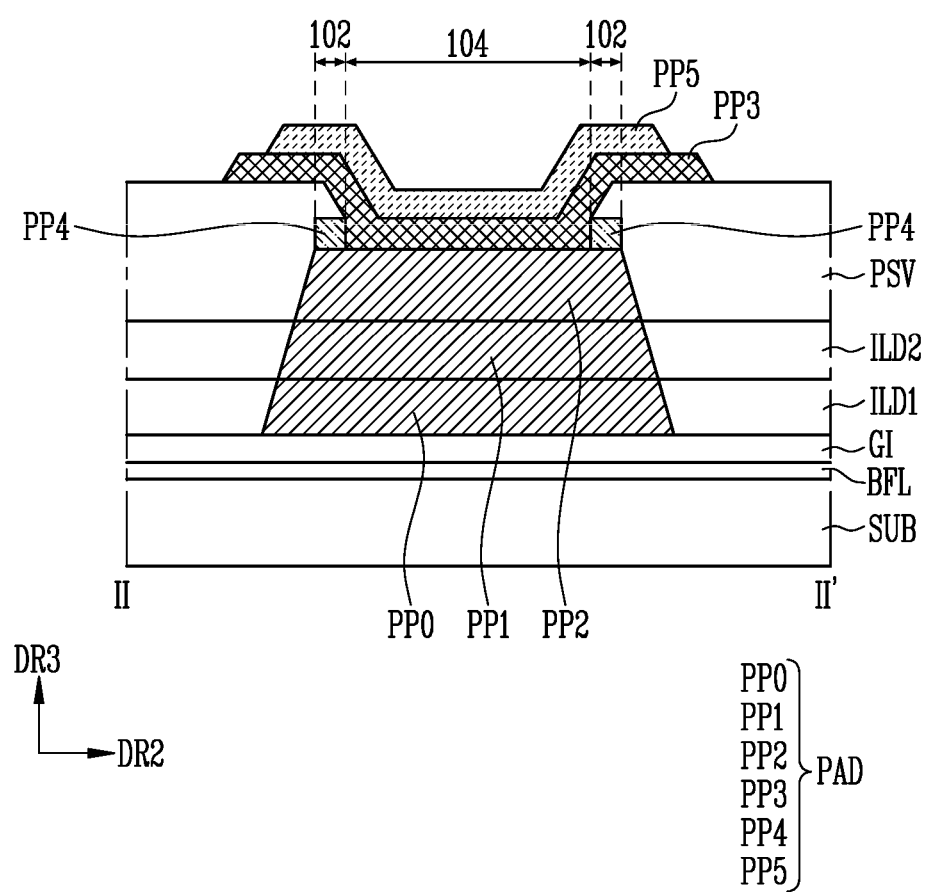
FIGS. 6 and 7 are sectional views taken along the line II-II' shown in FIG. 3 in accordance with embodiments of the present disclosure.
Figure 7:
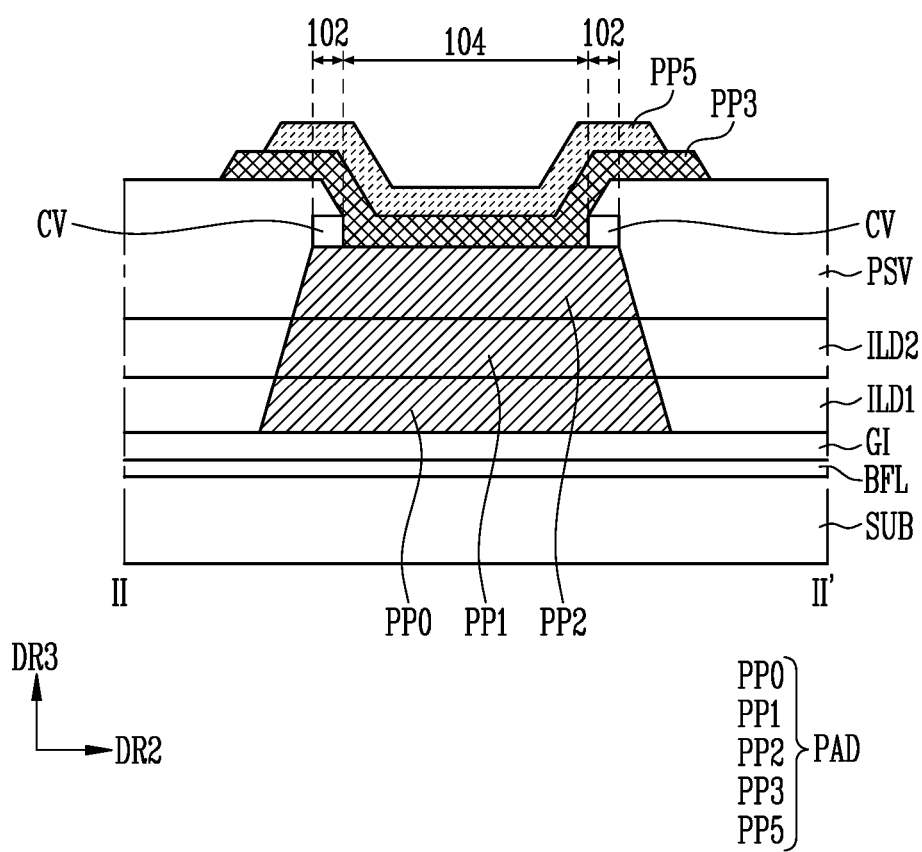

FIGS. 6 and 7 are sectional views taken along the line II-II' of FIG. 3. FIG. 6 is a structure of a pad PAD included in the display device in accordance with an embodiment of the present disclosure and illustrates an embodiment including a fourth pad pattern PP4. FIG. 7 is a structure of a pad PAD included in the display device in accordance with an embodiment of the present disclosure and illustrates an embodiment having a cavity CV.

First, referring to FIG. 6, the substrate SUB, the buffer layer BFL located on the substrate SUB, the gate insulating layer GI located on the buffer layer BFL, the first interlayer insulating layer ILD1 located on the gate insulating layer GI, the second interlayer insulating layer ILD2 located on the first interlayer insulating layer ILD1, and the protective layer PSV located on the second interlayer insulating layer ILD2 may be provided in the pad area PDA. The substrate SUB, the buffer layer BFL, the gate insulating layer GI, the first interlayer insulating layer ILD1, and the second interlayer insulating layer IDL2 have been described above with reference to FIG. 5, and therefore, repeated descriptions will be omitted.

The pad PAD may include a zeroth pad pattern PP0, a first pad pattern PP1, a second pad pattern PP2, a third pad pattern PP3, the fourth pad pattern PP4, and a fifth pad pattern PP5.

The zeroth pad pattern PP0 may be disposed in the pad area PDA. The zeroth pad pattern PP0 may be located on the gate insulating layer GI. The zeroth pad pattern PP0 may be located on a rear (or bottom) surface of the first pad pattern PP1.

The zeroth pad pattern PP0 may include a conductive material. In an example, the zeroth pad pattern PP0 may include metal, such as molybdenum (Mo), magnesium (Mg), silver (Ag), platinum (Pt), palladium (Pd), gold (Au), nickel (Ni), neodymium (Nd), iridium (Ir), chromium (Cr), titanium (Ti), and/or an alloy thereof. The zeroth pad pattern PP0 may not include aluminum (Al) or an alloy thereof.

The first pad pattern PP1 may be disposed in the pad area PDA. The first pad pattern PP1 may be located on the zeroth pad pattern PP0. The zeroth pad pattern PP0 and the first pad pattern PP1 may be electrically connected to each other. In some embodiments, the first interlayer insulating layer ILD1 may be located between the zeroth pad pattern PP0 and the first pad pattern PP1, and the zeroth pad pattern PP0 and the first pad pattern PP1 may be electrically connected to each other through a contact opening (e.g., a contact hole) formed in the first interlayer insulating layer ILD1.

The first pad pattern PP1 may include a conductive material. In an example, the first pad pattern PP1 may include metal, such as molybdenum (Mo), magnesium (Mg), silver (Ag), platinum (Pt), palladium (Pd), gold (Au), nickel (Ni), neodymium (Nd), iridium (Ir), chromium (Cr), titanium (Ti), and/or an alloy thereof. The first pad pattern PP1 may not include aluminum (Al) or an alloy thereof.

The second pad pattern PP2 may be arranged in the pad area PDA. The second pad pattern PP2 may be located in the same layer as the protective layer PSV. The second pad pattern PP2 may be located on the first pad pattern PP1. The first pad pattern PP1 and the second pad pattern PP2 may be electrically connected to each other. In some embodiments, the second interlayer insulating layer ILD2 may be located between the first pad pattern PP1 and the second pad pattern PP2, and the first pad pattern PP1 and the second pad pattern PP2 may be electrically connected to each other through a contact opening (e.g., a contact hole) formed in the second insulating layer ILD2.

The second pad pattern PP2 may include a conductive material. In an example, the second pad pattern PP2 may include metal, such as molybdenum (Mo), magnesium (Mg), silver (Ag), platinum (Pt), palladium (Pd), gold (Au), nickel (Ni), neodymium (Nd), iridium (Ir), chromium (Cr), titanium (Ti), and/or an alloy thereof. In one embodiment, the second pad pattern PP2 may include titanium (Ti). The second pad pattern PP2 may not include aluminum (Al) or an alloy thereof. This will be described in more detail later with reference to FIGS. 11 to 24, and therefore, repeated descriptions will be omitted.

The third pad pattern PP3 may be arranged in the pad area PDA. The third pad pattern PP3 may be located on the second pad pattern PP2. At least a portion of the third pad pattern PP3 may be located on the protective layer PSV. The third pad pattern PP3 located in a first area 102 may not contact an upper surface of the second pad pattern PP2. The third pad pattern PP3 located in a second area 104 may contact the upper surface of the second pad pattern PP2. The third pad pattern PP3 may be electrically connected to the second pad pattern PP2. The protective layer PSV may include an opening exposing at least a portion of the second pad pattern PP2, and the third pad pattern PP3 may be connected to the second pad pattern PP2 through the opening.

The third pad pattern PP3 may include the same material as the first contact electrode CNE1. The third pad pattern PP3 may be formed at the same time as (e.g., concurrently with) the first contact CNE1. The third pad pattern PP3 may not include aluminum (Al) or an alloy thereof. In an example, as described above with reference to the first contact electrode CNE1, the third pad pattern PP3 may include at least one conductive material, such as Indium Tin Oxide (ITO), Indium Zinc Oxide (IZO), and Indium Tin Zinc Oxide (ITZO).

The fourth pad pattern PP4 may be arranged in the pad area PDA. The fourth pad pattern PP4 may be located on the second pad pattern PP2. The fourth pad pattern PP4 may be located between the protective layer PSV and the second pad pattern PP2. The fourth pad pattern PP4 may be located on a partial area of the second pad pattern PP2. For example, the second pad pattern PP2 may have the first area 102 and the second area 104, and the fourth pad pattern PP4 may be located on the second pad pattern PP2 in the first area 102. The fourth pad pattern PP4 may not be disposed on the second pad pattern PP2 in the second area 104. The protective layer PSV may not be located in the second area 104. In the first area 102, the second pad pattern PP2, the third pad pattern PP3, and the fourth pad pattern PP4 may overlap with each other.

The fourth pad pattern PP4 may include metal, such as molybdenum (Mo), magnesium (Mg), silver (Ag), platinum (Pt), palladium (Pd), gold (Au), nickel (Ni), neodymium (Nd), iridium (Ir), chromium (Cr), and/or an alloy thereof. In one embodiment, the fourth pad pattern PP4 may not include titanium (Ti), aluminum (Al), or an aluminum alloy.

In accordance with an embodiment, each of the zeroth pad pattern PP0, the first pad pattern PP1, the second pad pattern PP2, the fourth pad pattern PP4 may be formed through the same process as any one of the electrode components (e.g., the electrode components included in the pixel circuit part PCL) described above with reference to FIG. 5.

In an example, the first pad pattern PP1 may be formed at the same time as the gate electrode GE, and the second pad pattern PP2 may be formed at the same time as the first transistor electrode TE1 and the second transistor electrode TE2. In another example, both the first pad pattern PP1 and the second pad pattern PP2 may be formed at the same time as the first transistor electrode TE1 and the second transistor electrode TE2. However, a process time at which the zeroth pattern PP0, the first pad pattern PP1, the second pad pattern PP2, and the fourth pad pattern PP4 are manufactured is not limited to a specific example.

The fifth pad pattern PP5 may be arranged in the pad area PDA. The fifth pad pattern PP5 may be located on the third pad pattern PP3. The fifth pad pattern PP5 may be electrically connected to the third pad pattern PP3.

The fifth pad pattern PP5 may include the same material as the second contact electrode CNE2. The fifth pad pattern PP5 may be formed at the same time as the second contact electrode CNE2. The fifth pad pattern PP5 may not include aluminum (Al) or an alloy thereof. In an example, the fifth pad pattern PP5 may include any one of a conductive material, such as Indium Tin Oxide (ITO), Indium Zinc Oxide (IZO), and Indium Tin Zinc Oxide (ITZO).

The pad PAD shown in FIG. 7 is different from the pad PAD described above with reference to FIG. 6 in that the pad PAD shown in FIG. 7 does not include the fourth pad pattern PP4. In accordance with this embodiment, the pad PAD may not include the fourth pad pattern PP4. The pad PAD may have the cavity CV.

The cavity CV may be a space defined by the protective layer PSV, the second pad pattern PP2, and the third pad pattern PP3. The cavity CV may be an empty space on the second pad pattern PP2. The cavity CV may be located between the protective layer PSV and the second pad pattern PP2. The cavity CV may be located on a partial area of the second pad pattern PP2. For example, the second pad pattern PP2 may have the first area 102 and the second area 104, and the cavity CV may be located on the second pad pattern PP2 in the first area 102. The cavity CV may not be disposed on the second pad pattern PP2 in the second area 104. The cavity CV may be located in the same layer as the third pad pattern PP3 arranged in the second area 104.

Hereinafter, the display device and a pad PAD in accordance with another embodiment of the present disclosure will be described with reference to FIGS. 8 to 10. In the following embodiment, components identical or substantially similar to those of the above-described embodiments are designated by like reference numerals, and their descriptions will be omitted or simplified. To that end, aspects different from those of the above-described embodiment will be primarily described.

Figure 8:
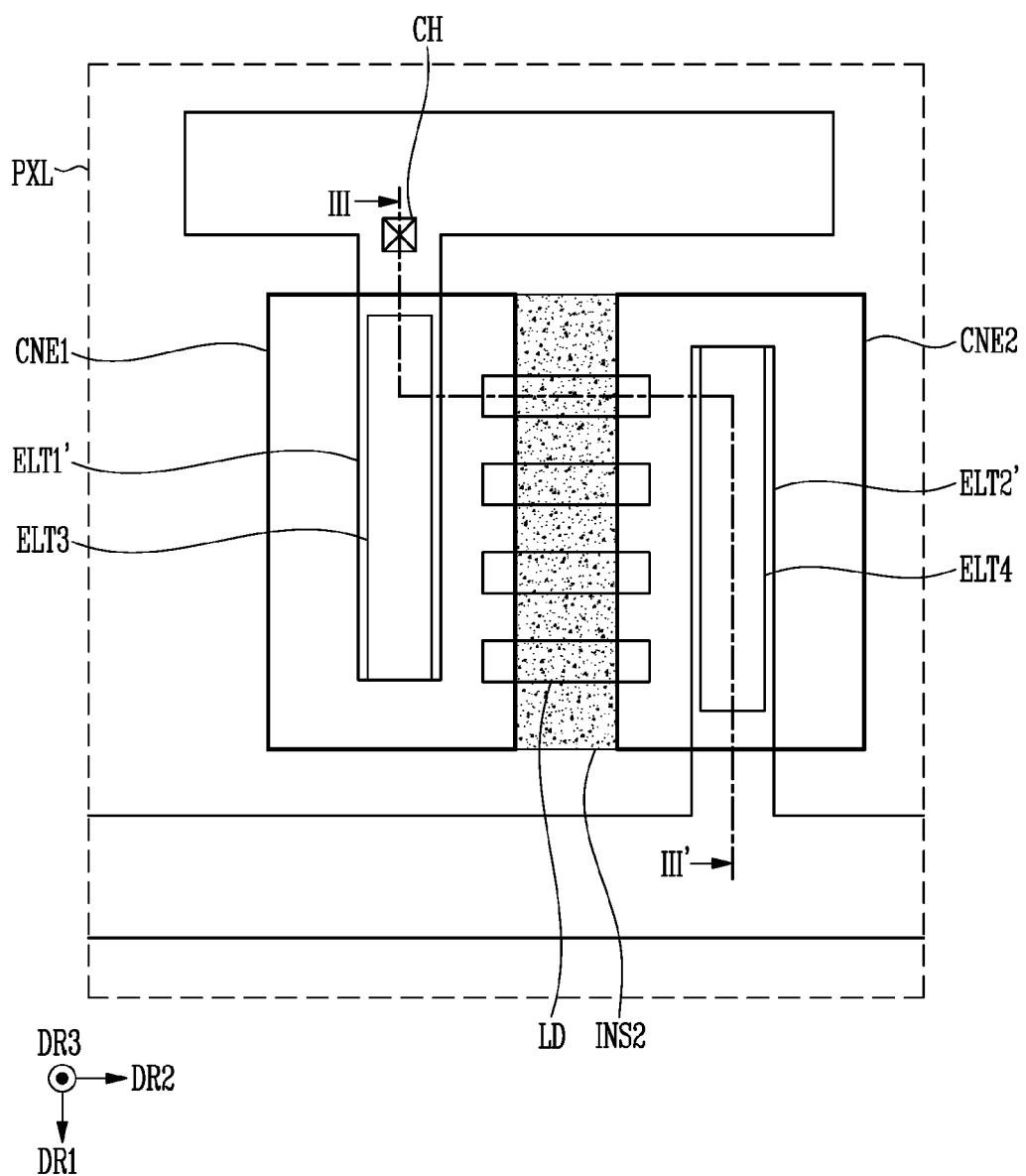
FIG. 8 is a top view schematically illustrating a pixel in accordance with another embodiment of the present disclosure.
Figure 9:
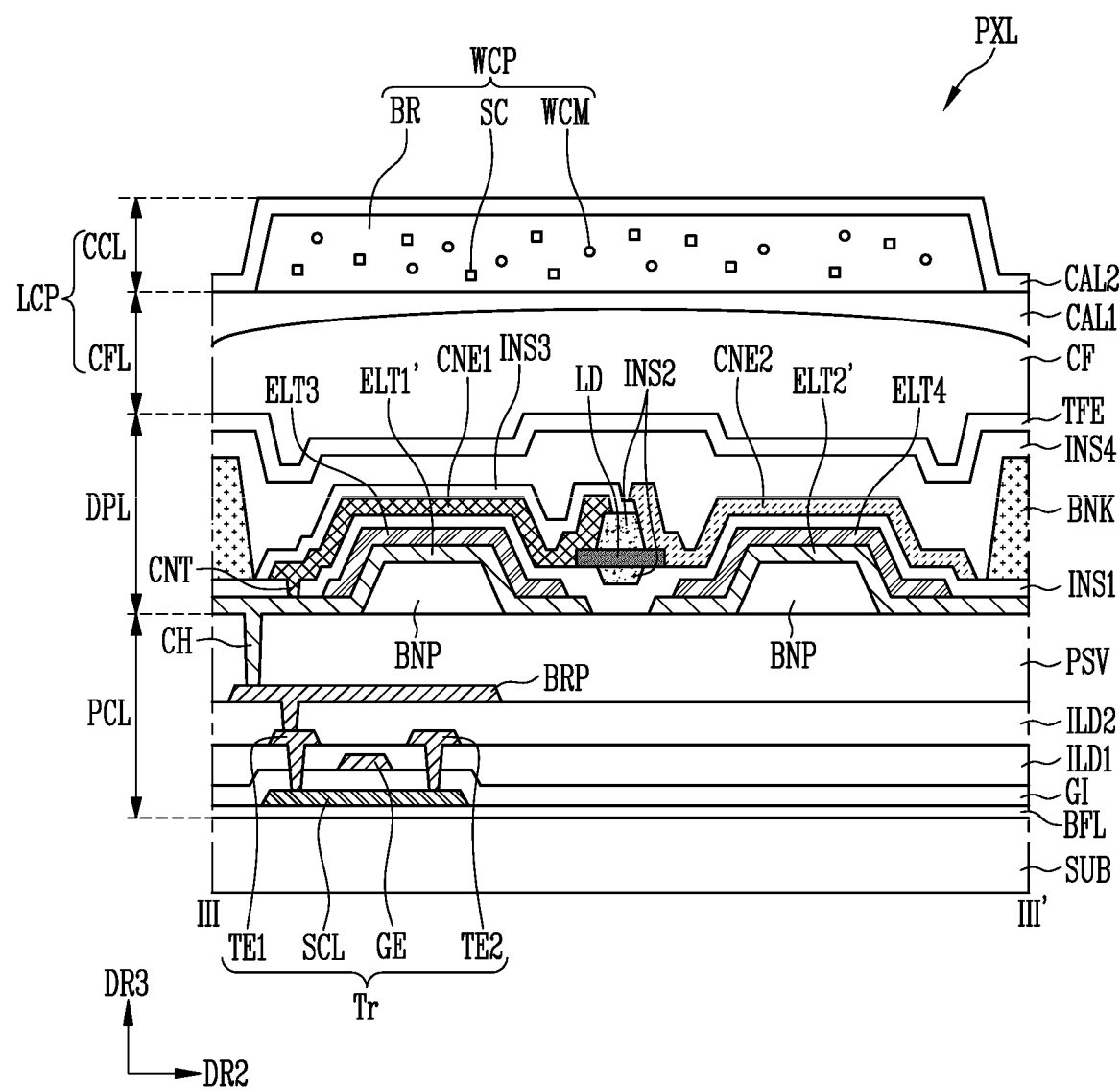
FIG. 9 is a sectional view taken along the line III-III' shown in FIG. 8.
Figure 10:
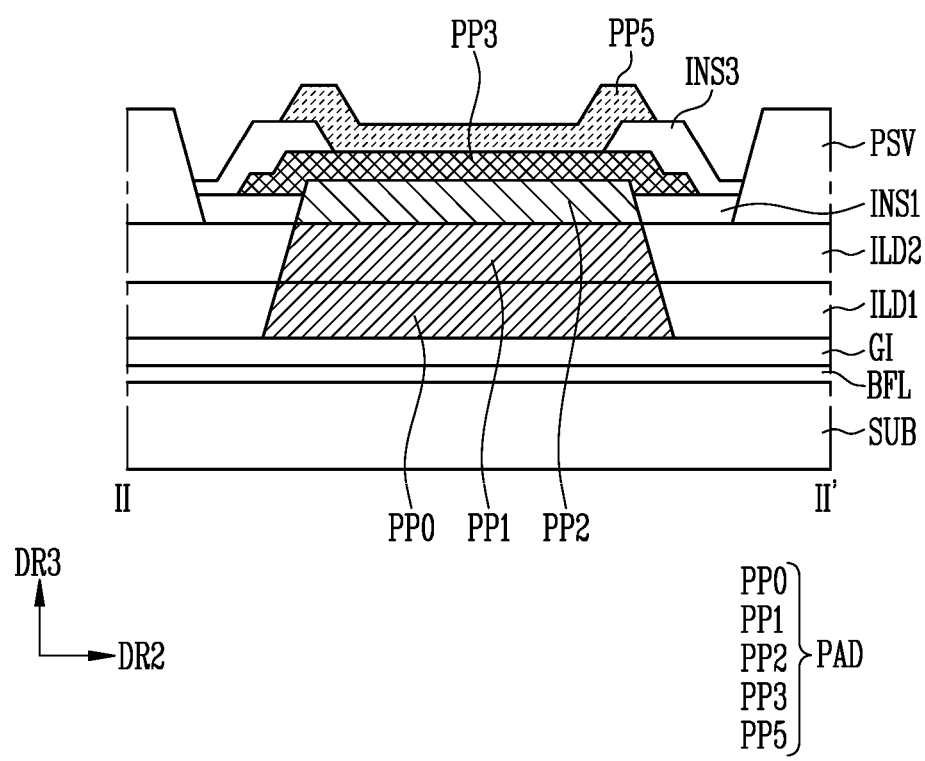
FIG. 10 is a sectional view taken along the line II-II' shown in FIG. 3 in accordance with an embodiment of the present disclosure.

FIG. 8 is a top view schematically illustrating a pixel in accordance with another embodiment of the present disclosure, FIG. 9 is a sectional view taken along the line III-III' shown in FIG. 8, and FIG. 10 is a sectional view taken along the line II-II' shown in FIG. 3 according to another embodiment.

Referring to FIGS. 8 and 9, the pixel PXL included in the display device in accordance with another embodiment of the present disclosure may further include a second reflective electrode different from the first reflective electrode. According to an embodiment, the second reflective electrode may be referred to as a second arranged electrode. The pixel PXL in accordance with this embodiment may include a first electrode ELT1' and a second electrode ELT2', which act as the first reflective electrode, and may include a third electrode ELT3 and a fourth electrode ELT4, which act as the second reflective electrode. For example, the third electrode ELT3 and the fourth electrode ELT4, which act as the second reflective electrode, are provided to further improve the light emission efficiency of a light emitting element LD.

The second reflective electrode defined in this specification is an electrode component arranged on the first reflective electrode and may be an electrode component configured to reflect light emitted from the light emitting element LD. In this embodiment, the first electrode ELT1' and the second electrode ELT2', which act as the first reflective electrode, may include a material different from that of the third electrode ELT3 and the fourth electrode ELT4, which act as the second reflective electrode.

The third electrode ELT3 and the fourth electrode ELT4 may include a first material having a first reflexibility, and the first electrode ELT1' and the second electrode ELT2' may include a second material having a second reflexibility smaller than the first reflexibility. In an example, different from the embodiment described above with reference to FIGS. 4 to 7, the third electrode ELT3 and the fourth electrode ELT4 may include aluminum (Al) or an alloy including the same, and the first electrode ELT1' and the second electrode ELT2' may not include aluminum (Al) or an alloy thereof.

The third electrode ELT3 may be arranged on the first electrode ELT1'. At least a portion of the third electrode ELT3 may be located on the bank pattern BNP to reflect light emitted from the light emitting element LD in a display direction. The third electrode ELT3 may not be arranged on at least a partial surface of the first electrode ELT1'.

The third electrode ELT3 may include a material different from that of the first electrode ELT1'. In an example, the third electrode ELT3 may include metal, such as molybdenum (Mo), magnesium (Mg), silver (Ag), platinum (Pt), palladium (Pd), gold (Au), nickel (Ni), neodymium (Nd), iridium (Ir), chromium (Cr), titanium (Ti), aluminum (Al), and/or an alloy thereof and may include a material different from that included in at least the first electrode ELT1'. In one embodiment, the third electrode ELT3 may include aluminum (Al) or an alloy including the same.

The fourth electrode ELT4 may be arranged on the second electrode ELT2'. At least a portion of the fourth electrode ELT4 may be located on the bank pattern BNP to reflect light emitted from the light emitting element LD in the display direction. The fourth electrode ELT4 may not be arranged on at least a partial surface of the second electrode ELT2'.

The fourth electrode ELT4 may include a material different from that of the second electrode ELT2'. In an example, the fourth electrode ELT4 may include metal, such as molybdenum (Mo), magnesium (Mg), silver (Ag), platinum (Pt), palladium (Pd), gold (Au), nickel (Ni), neodymium (Nd), iridium (Ir), chromium (Cr), titanium (Ti), aluminum (Al), and/or an alloy thereof and may include a material different from that included in at least the second electrode ELT2'. In one embodiment, the fourth electrode ELT4 may include aluminum (Al) or an alloy including the same.

The third electrode ELT3 and the fourth electrode ELT4 may include the same material. The third electrode ELT3 and the fourth electrode ELT4 may be formed through the same process to be provided at the same time.

The light emitting element LD may be arranged between the third electrode ELT3 and the fourth electrode ELT4. The light emitting element LD may be located on a first insulating layer INS1 located on the third electrode ELT3 and the fourth electrode ELT4.

In accordance with this embodiment, at least a portion of the first insulating layer INS1 may be formed over the third electrode ELT3 and the fourth electrode ELT4. A contact part (e.g., a contact opening) CNT may be formed in the first insulating layer INS1. The contact part CNT may be provided in the form of an opening in the first insulating layer INS1. When viewed on a plane, the contact part CNT may not overlap the third electrode ELT3.

The first contact electrode CNE1 may be connected to the first electrode ELT1' through the contact part CNT. A first contact electrode CNE1 may be electrically connected to the first electrode ELT1' through the contact part CNT.

For example, in accordance with this embodiment, the transistor Tr and the first contact electrode CNE1 may be electrically connected to each other through the first electrode ELT1'. As shown in FIG. 9, the first contact electrode CNE1 may be electrically connected to the first electrode ELT1' through the contact part CNT, and the first electrode ELT1' may be electrically connected to the transistor Tr.

The first contact electrode CNE1 does not pass through the third electrode ELT3 but is electrically connected to the first electrode ELT1' so that electrical reliability can be improved. For example, when the first contact electrode CNE1 is electrically connected to the first electrode ELT1' through the third electrode ELT3 distortion of an electrical signal provided from the transistor Tr may occur due to a change in resistance as the electrical signal moves through each electrode component. In comparison, in accordance with this embodiment, the first electrode ELT1' and the first contact electrode CNE1 are directly connected to each other so that distortion of the electrical signal can be prevented or reduced. For example, when the third electrode ELT3 acting as the second reflective electrode includes aluminum (Al), an oxide layer is formed on a surface thereof contacting the first electrode ELT1' when the third electrode ELT3 is formed, and therefore, electrical resistance may be excessively increased. However, in this embodiment, the first electrode ELT1' and the first contact electrode CNE1 are directly connected to each other so that influence due to the excessively increased electrical resistance between the first electrode ELT1' and the third electrode ELT3 can be reduced or altogether avoided.

Although an embodiment in which the second contact electrode CNE2 does not contact the second electrode ELT2' is illustrated in FIG. 9, the present disclosure is not limited thereto. In some embodiments, similarly to the first contact electrode CNE1, the second contact electrode CNE2 may be connected to the second electrode ELT2' through a contact part (e.g., a contact opening) formed in the first insulating layer INS1.

Hereinafter, the pad PAD included in the display device in accordance with the embodiment of the present disclosure will be described with reference to FIG. 10.

Referring to FIG. 10, the pad PAD included in the display device in accordance with another embodiment of the present disclosure may not include the fourth pad pattern PP4. The pad PAD may include a zeroth pad pattern PP0, a first pad pattern PP1, a second pad pattern PP2, a third pad pattern PP3, and a fifth pad pattern PP5.

The zeroth pad patter PP0 may be arranged in the pad area PDA. The zeroth pad pattern PP0 may be arranged on a rear (or bottom) surface of the first pad pattern PP1. The zeroth pad pattern PP0 may be electrically connected to the first pad pattern PP1.

The first pad pattern PP1 may be arranged in the pad area PDA. The first pad pattern PP1 may be arranged on the zeroth pad pattern PP0. The first pad pattern PP1 may be electrically connected to the zeroth pattern PP0.

The first pad pattern PP1 may include a material different from that of the second reflective electrode (e.g., the third electrode ELT3 and/or the fourth electrode ELT4) arranged in the display area DA.

The second pad pattern PP2 may be arranged in the pad area PDA. The second pad pattern PP2 may be arranged on the first pad pattern PP1. The second pad pattern PP2 may be located between protective layers PSV (e.g., may be located in a groove or opening in the protective layer PSV). The second pad pattern PP2 may be electrically connected to the first pad pattern PP1.

The second pad pattern PP2 may be arranged on a top surface of the first pad pattern PP1. In some embodiments, the second pad pattern PP2 may cover the entire top surface of the first pad pattern PP1, and at least a portion of the second pad pattern PP2 may extend to cover a side surface of each of the zeroth pad pattern PP0 and the first pad pattern PP1. However, the present disclosure is not limited thereto.

The second pad pattern PP2 may include the same material as the first electrode ELT1' and/or the second electrode ELT2'. The second pad pattern PP2 may be formed at the same time as the first electrode ELT1' and/or the second electrode ELT2'. The second pad pattern PP2 may include a material different from that of the second reflective electrode (e.g., the third electrode ELT3 and/or the fourth electrode ELT4) arranged in the display area DA.

The third pad pattern PP3 may be arranged on the second pad pattern PP2. A portion of the third pad pattern PP3 may be arranged on the first insulating layer INS1 arranged between the second pad pattern PP2 and the protective layer PSV.

The third pad pattern PP3 may include the same material as the first contact electrode CNE1. The third pad pattern PP3 may include a material different from that of the second reflective electrode (e.g., the third electrode ELT3 and/or the fourth electrode ELT4) arranged in the display area DA.

The fourth pad pattern PP4 or the cavity CV may not be provided in the pad PAD in accordance with this embodiment. Accordingly, the third pad pattern PP3 may cover (e.g., may entirely cover) a top surface of the second pad pattern PP2.

The fifth pad pattern PP5 may be arranged on the third pad pattern PP3. At least a portion of the fifth pad pattern PP5 may be arranged in an opening defined by a third insulating layer INS3 formed on the third pad pattern PP3. The fifth pad pattern PP5 may include the same material as the second contact electrode CNE2. The fifth pad pattern PP5 may include a material different from that of the second reflective electrode (e.g., the third electrode ELT3 and/or the fourth electrode ELT4) arranged in the display area DA.

Hereinafter, a manufacturing method of the display device in accordance with an embodiment of the present disclosure will be described with reference to FIGS. 11 to 24.

FIGS. 11 to 24 are sectional process views illustrating a manufacturing method of the display device in accordance with an embodiment of the present disclosure.

FIGS. 11 to 18, 20, and 22 to 24 are sectional process views illustrating a manufacturing process of a pad PAD included in the display device in accordance with an embodiment of the present disclosure. FIGS. 19 and 21 are sectional process views illustrating processes performed in the display area DA. The views shown in FIGS. 11 to 18, 20, and 22 to 24 are sectional process views illustrating a manufacturing method of a sectional structure taken along the line II-II' of FIG. 3. The views shown in FIGS. 19 and 21 are sectional process views illustrating a manufacturing method of a sectional structure taken along the line I-I' of FIG. 4.

Figure 11:
FIGS. 11 to 24 are sectional process views illustrating a manufacturing method of a display device in accordance with an embodiment of the present disclosure.

Referring to FIG. 11, a substrate SUB may be prepared, a buffer layer BFL may be located on the substrate SUB, and a gate insulating layer GI may be located on the buffer layer BFL. The substrate SUB may be a base plate on which a structure of the pad PAD is formed. The substrate SUB may be a base plate on which the pixel circuit part PCL and the display element part DPL are formed. The buffer layer BFL and the gate insulating layer GI may be insulating layers located on the bottom of (or below) the zeroth to third pad patterns PP0 to PP3 of the pad PAD. The buffer layer BFL and the gate insulating layer GI may be insulating layers included in the pixel circuit part PCL.

Figure 12:
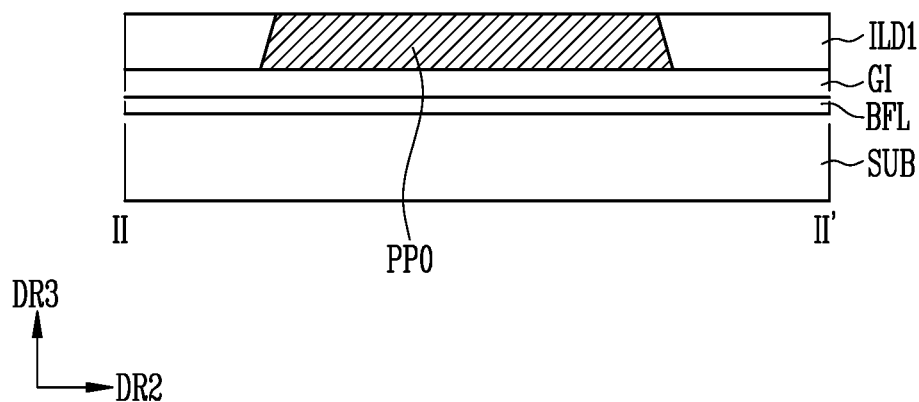

Referring to FIG. 12, the zeroth pad pattern PP0 may be formed on the gate insulating layer GI. The zeroth pad pattern PP0 may be disposed on the gate insulating layer GI in the pad area PDA. Subsequently, a first insulating layer ILD1 may be located on the gate insulating layer GI. The first interlayer insulating layer ILD1 may be formed on one surface of the gate insulating layer GI at where the zeroth pad pattern PP0 is not formed.

Figure 13:
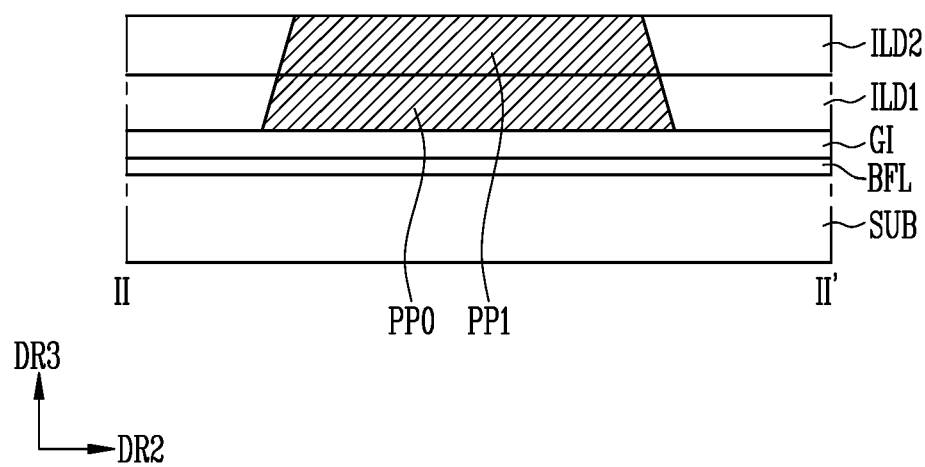

Referring to FIG. 13, the first pad pattern PP1 may be formed on the zeroth pad pattern PP0. The first pad pattern PP1 may be physically in contact with the zeroth pattern PP0. Subsequently, a second interlayer insulating layer ILD2 may be located. The second interlayer insulating layer ILD2 may be formed on one surface of the first interlayer insulating layer ILD1 at where the first pad pattern PP1 is not formed. In other embodiments, the second interlayer insulating layer ILD2 may be formed between the first pad pattern PP1 and the zeroth pad pattern PP0, and the zeroth pad pattern PP0 and the first pad pattern PP1 may be electrically connected to each other through a contact opening formed in the second insulating layer ILD2.

Figure 14:
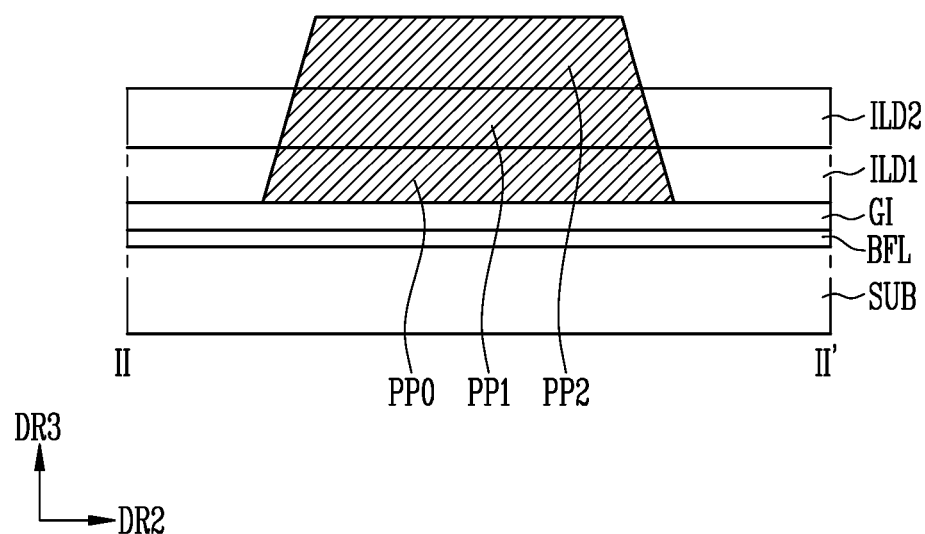

Referring to FIG. 14, the second pad pattern PP2 may be formed on the first pad pattern PP1. The second pad pattern PP2 may be electrically connected to the first pad pattern PP1. The second pad pattern PP2 may include a material strong against (e.g., resistant to) an etchant used in an etching process for forming a first electrode ELT1 and a second electrode ELT2, which are formed in the display element part DPL. The second pad pattern PP2 may not be etched by the etchant used in the etching process for forming the first electrode ELT1 and the second electrode ELT2, which act as a first reflective electrode of a light emitting element LD.

As described above, the second pad pattern PP2 may include titanium (Ti). Because the second pad pattern PP2 includes titanium (Ti), the second pad pattern PP2 may not be etched by the etchant used to form the first electrode ELT1 and the second electrode ELT2.

Figure 15:
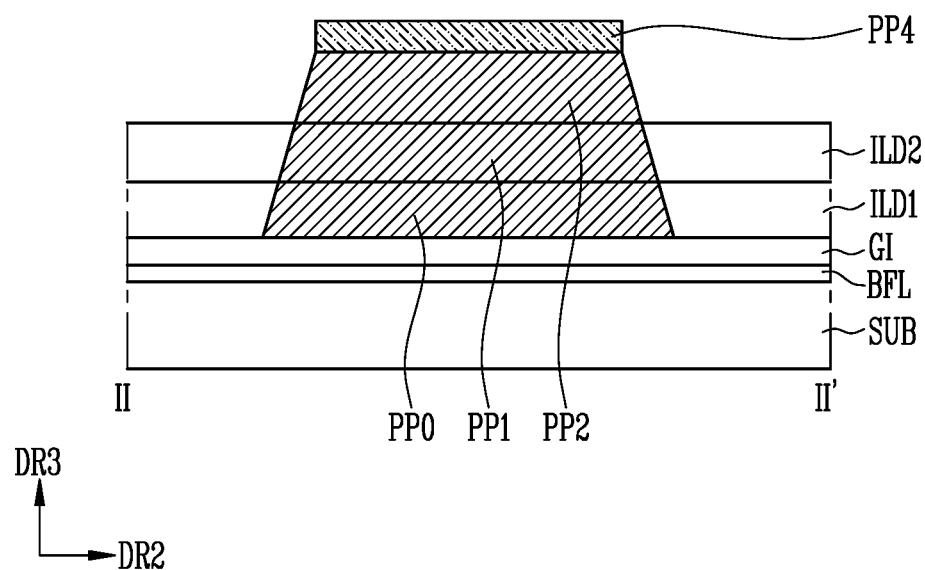

Referring to FIG. 15, a fourth pad pattern PP4 may be formed on the second pad pattern PP2. The fourth pad pattern PP4 may be located to cover the entire surface (e.g., the entire upper surface) of the second pad pattern PP2. The fourth pad pattern PP4 may be electrically connected to the second pad pattern PP2. The fourth pad pattern PP4 may not include the material strong against the etchant used in the etching process for forming the first electrode ELT1 and the second electrode EL2. In an example, the fourth pad pattern PP4 may not include titanium (Ti).

Figure 16:
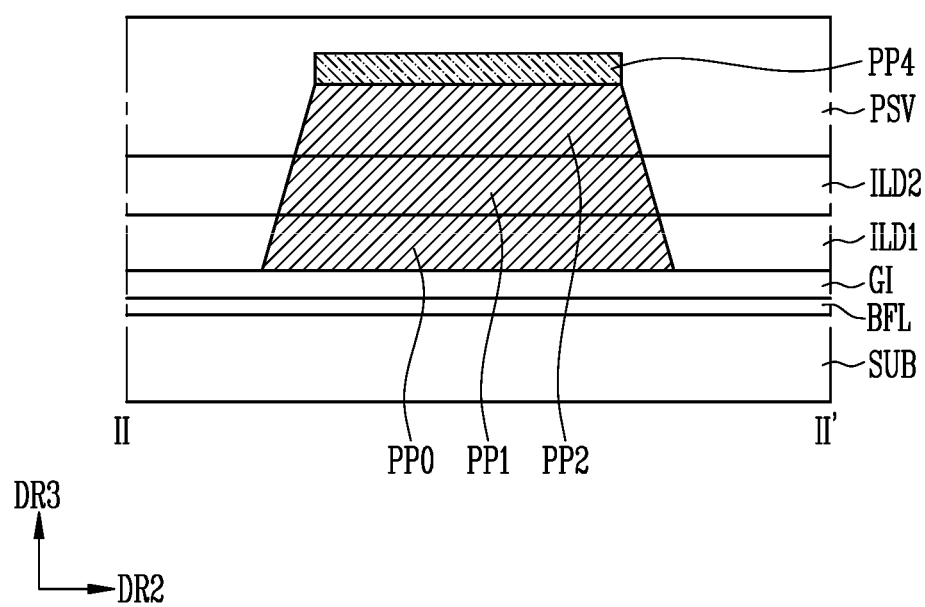
Figure 17:
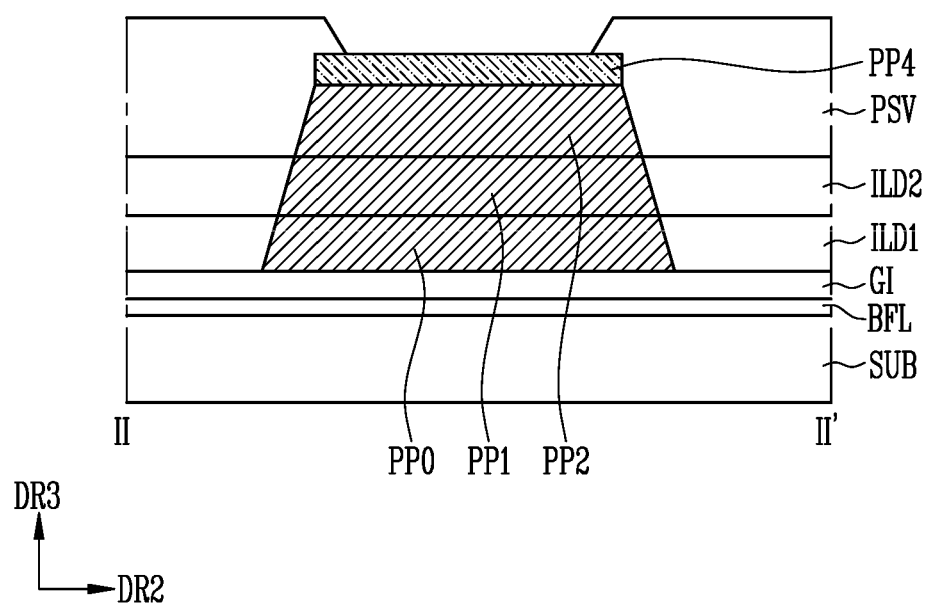

Referring to FIGS. 16 and 17, the protective layer PSV may be formed on the second interlayer insulating layer ILD2, and then at least a portion of the protective layer PSV may be removed. The protective layer PSV may be arranged to cover the fourth pad pattern PP4. At least a portion of the fourth pad pattern PP4 may be exposed to the outside by removing at least a portion of the protective layer PSV.

Figure 18:
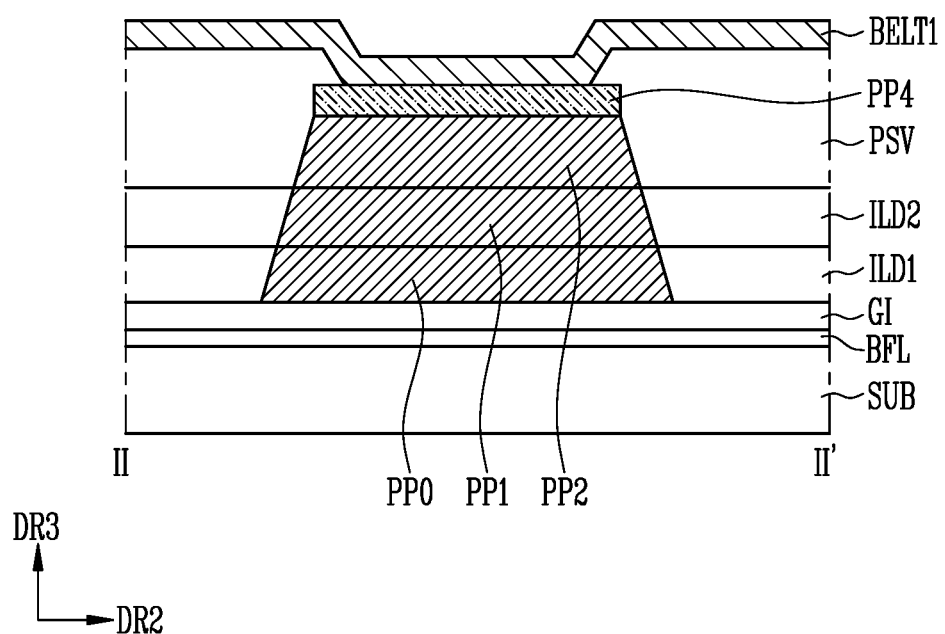
Figure 19:
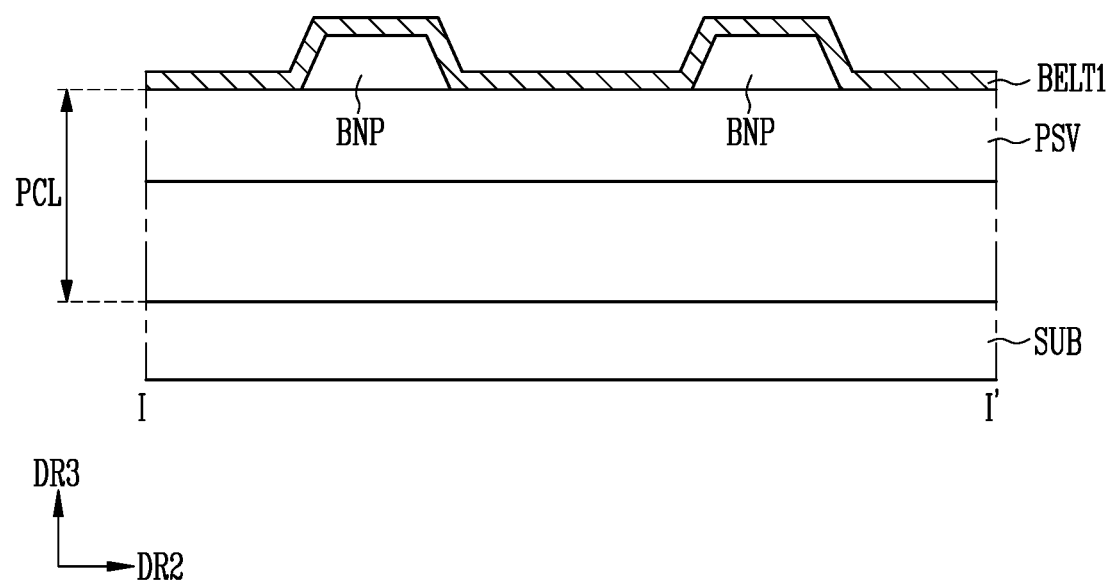

Referring to FIGS. 18 and 19, a first base electrode layer BELT1 may be formed. FIG. 18 is a view illustrating a partial section of the pad area PDA when the first base electrode layer BELT1 is formed. FIG. 19 is a view illustrating a partial section of the display area DA when the first base electrode layer BELT1 is formed.

First, referring to FIG. 18, the first base electrode layer BELT1 may be formed on the protective layer PSV in the pad area PDA. The first base electrode layer BELT1 may be formed on the protective layer PSV in the pad area PDA. The first base electrode layer BELT1 may be formed to cover the fourth pad pattern PP4.

Next, referring to FIG. 19, the bank pattern BNP having a shape protruding in the display direction (e.g., the third direction DR3) may be formed on the substrate SUB in the display area DA, and the first base electrode layer BELT1 may be formed to at least cover the bank pattern BNP. At least a portion of the first base electrode layer BELT1 may be disposed on the protective layer PSV of the pixel circuit part PCL, and at least a portion of the first base electrode BELT1 may be disposed on the bank pattern BNP.

The first base electrode layer BELT1 may include a material having sufficient reflexibility. In an example, the first base electrode layer BELT1 may include aluminum (Al) or an alloy thereof.

Figure 20:
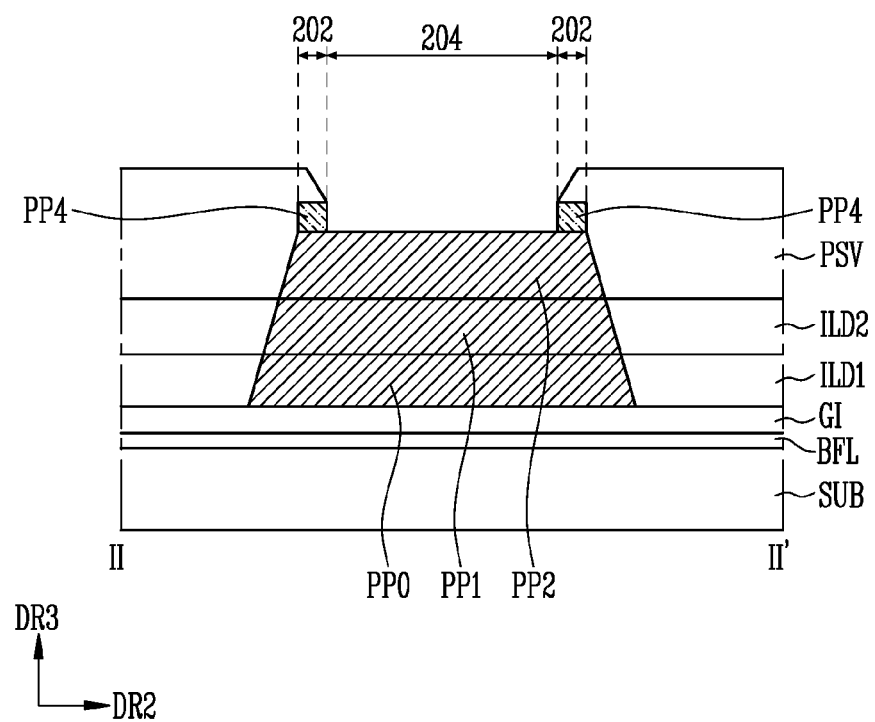
Figure 21:
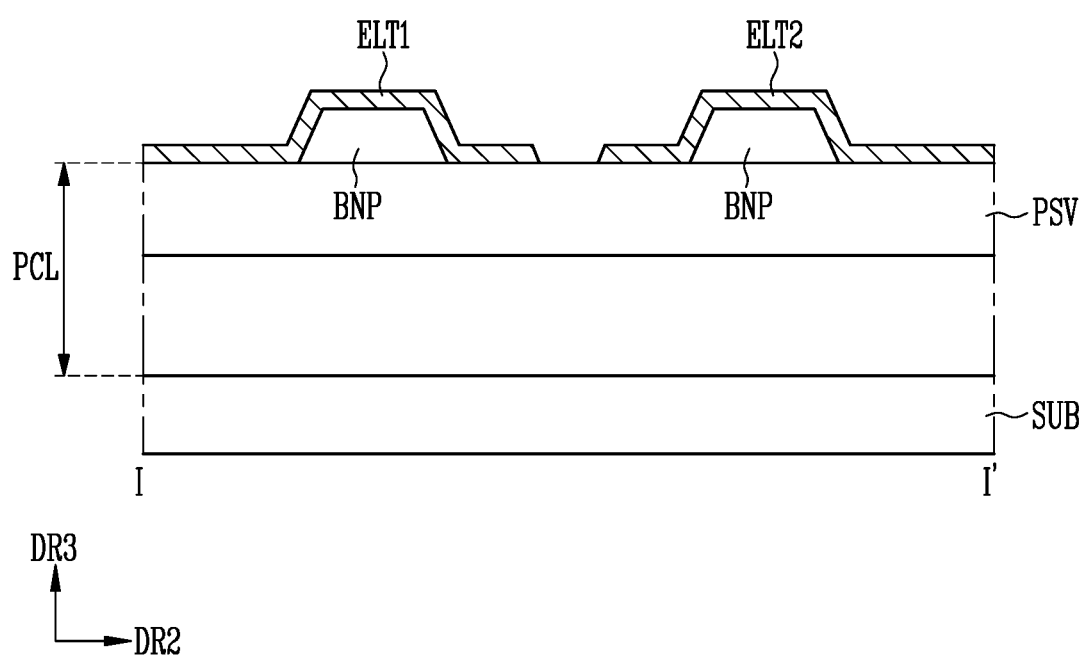

Referring to FIGS. 20 and 21, at least a portion of the first base electrode layer BELT1 may be removed. FIG. 20 is a view illustrating a partial section of the pad area PDA when at least a portion of the first base electrode layer BELT1 is removed. FIG. 21 is a view illustrating a partial section of the display area DA when at least a portion of the first base electrode layer BELT1 is removed.

Referring to FIG. 20, at least a portion of the first base electrode layer BELT1 formed in the pad area PDA may be removed. An etching process may be performed on the first base electrode layer BELT1 formed in the pad area PDA. The first base electrode layer BELT1 in contact with the fourth pad pattern PP4 may be at least removed.

Referring to FIG. 21, at least a portion of the first base electrode layer BELT1 formed in the display area DA may be removed. An etching process may be performed on the first base electrode layer BELT1 formed in the display area DA. When a portion of the first base electrode layer BELT1 is removed, the first electrode ELT1 and the second electrode ELT2 may be formed. At least a portion of each of the electrode ELT1 and the second electrode ELT2 may be located on the bank pattern BNP to act as a first reflective electrode of the light emitting element LD.

When this process is performed, the first base electrode layer BELT1 may not be disposed in the pad area PDA. That is, the first base electrode layer BELT1 arranged in the pad area PDA may be removed, and the first base electrode layer BELT1 arranged in the display area DA may be provided as the first electrode ELT1 and the second electrode ELT2 to be the first reflective electrode. Consequently, a component (e.g., the first electrode ELT1 and the second electrode ELT2) corresponding to the first reflective electrode may not be arranged in the pad area PDA. Accordingly, at least one of the first to fourth pad patterns PP1 to PP4 may not include the same material as the first reflective electrode. Each of the first to fourth pad patterns PP1 to PP4 may not include the same material as the first reflective electrode. In an example, each of the first to fourth pad patterns PP1 to PP4 may not include aluminum (Al).

Referring back to FIG. 20, when the etching process on the first base electrode layer BELT1 is performed in the pad area PDA, at least a portion of the fourth pad pattern PP4 may be removed.

When the first base electrode layer BELT1 is etched, the fourth pad pattern PP4 contacting the first base electrode layer BELT1 may be removed. In an example, when the first base electrode layer BELT1 includes aluminum (Al), an etchant for aluminum (Al) may be used in the etching process. The fourth pad pattern PP4 may be etched by the etchant for aluminum (Al), and a portion of the fourth pad pattern PP4 which is not removed may be located on the second pad pattern PP2. Referring to FIG. 20, the fourth pad pattern PP4 which is not removed may be located between the protective layer PSV and the second pad pattern PP2. The second pad pattern PP2 may have an arrangement area 202 in which the fourth pad pattern PP4 is arranged and a non-arrangement area 204 in which the fourth pad pattern PP4 is not arranged. In the arrangement area 202, the second pad pattern PP2 may overlap the fourth pad pattern PP4 and the protective layer PSV. In the non-arrangement area 204, the second pad pattern PP2 may not overlap the fourth pattern PP4 or the protective layer PSV. The arrangement area 202 may be the first area 102 described above with reference to FIGS. 6 and 7, and the non-arrangement area 204 may be the second area 104 described above with reference to FIGS. 6 and 7.

The second pad pattern PP2 may not be removed by the etchant for etching the first base electrode layer BELT1. The second pad pattern PP2 may include a material strong against the etchant for the first base electrode layer BELT1. As described above, in an example, the second pad pattern PP2 may include titanium (Ti). The second pad pattern PP2 may not be removed by the etchant for the first base electrode layer BELT1. Therefore, the second pad pattern PP2 may act as an etch stop layer for the first pad pattern PP1.

Figure 22:
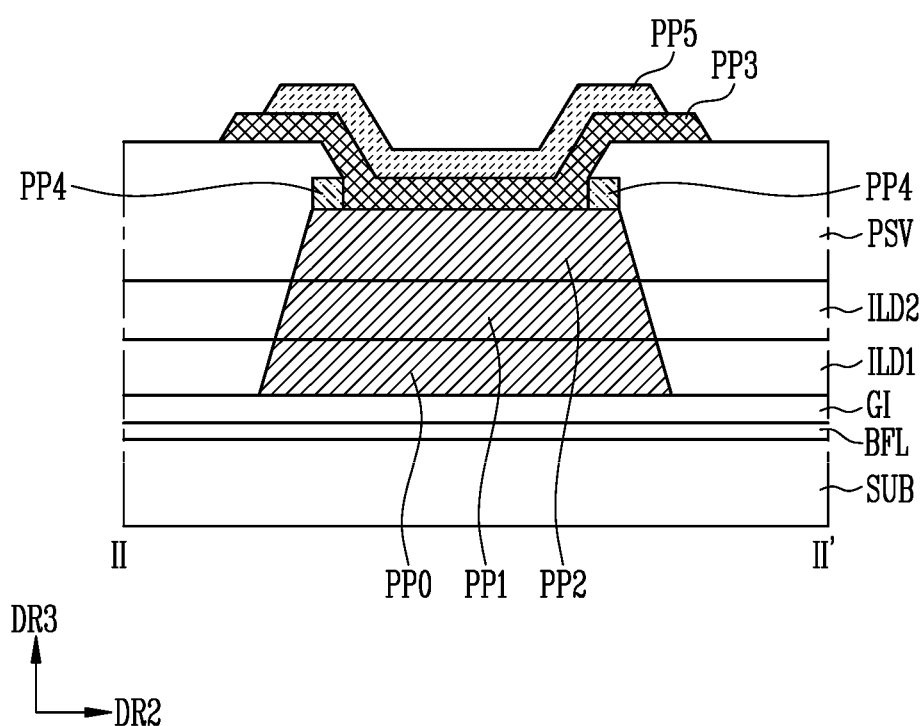
Figure 23:
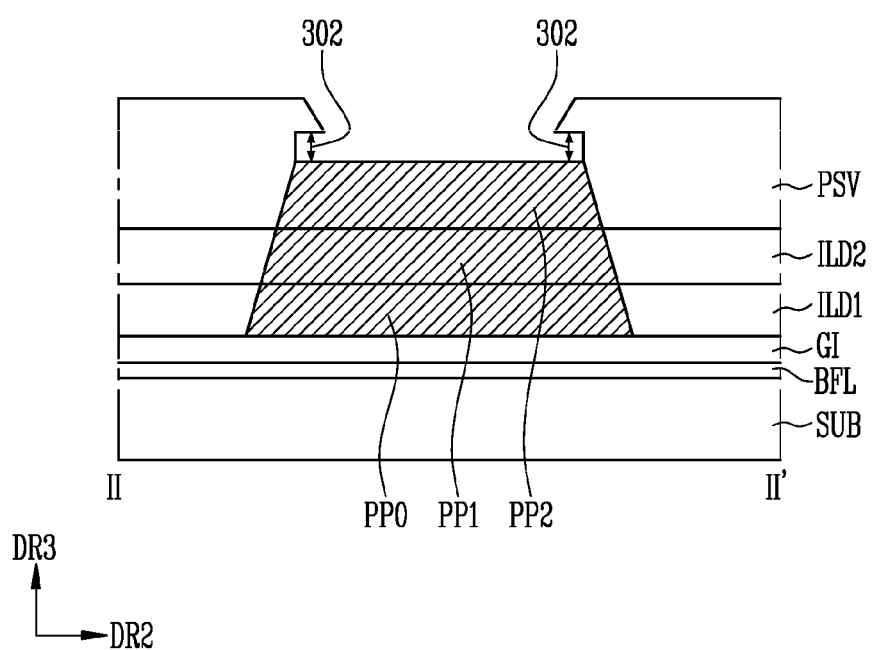

Referring to FIGS. 22 and 23, the third pad pattern PP3 and the fifth pad pattern PP5 may be patterned. The third pad pattern PP3 may be deposited on the entire surface of the pad area PDA, and then at least a portion of the third pad pattern PP3 may be removed. The third pad pattern PP3 may be located to be electrically connected to the second pad pattern PP2. After the third pad pattern PP3 is formed, the fifth pad pattern PP5 may be deposited on the entire surface of the pad area PDA, and then at least a portion of the fifth pad pattern PP5 may be removed. The fifth pad pattern PP5 may be located to be electrically connected to the third pad pattern PP3.

A process of disposing the light emitting element LD in the display area DA and a process of forming a first contact electrode CNE1 and a second contact electrode CNE2, which are respectively connected to one end and the other end of the light emitting element LD, may be further performed.

In accordance with an embodiment, the third pad pattern PP3 and the first contact electrode CNE1 may be formed through the same process, and the fifth pad pattern PP5 and the second contact electrode CNE may be formed through the same process. Accordingly, the third pad pattern PP3 may include the same material as the first contact electrode CNE1, and the fifth pad pattern PP5 may include the same material as the second contact electrode CNE2.

As described above, when the etching process on the first base electrode layer BELT1 is performed, at least a portion of the fourth pad pattern PP4 may be removed, and the portion of the fourth pattern PP4 that is not removed may be located between the second pad pattern PP2 and the protective layer PSV. However, in some embodiments, the entire fourth pad pattern PP4 may be removed during the etching process of the first base electrode layer BELT1. Hereinafter, an embodiment in which a cavity CV is provided when the entire fourth pad pattern PP4 is removed will be described with reference to FIGS. 23 and 24.

Referring to FIG. 23, when at least a portion of the first base electrode layer BELT1 formed in the pad area PDA is removed, the entire fourth pad pattern PP4 may be removed. The protective layer PSV may not be removed, and therefore, a gap 302 may occur (or may be formed) between the second pad pattern PP2 and the protective layer PSV.

Figure 24:
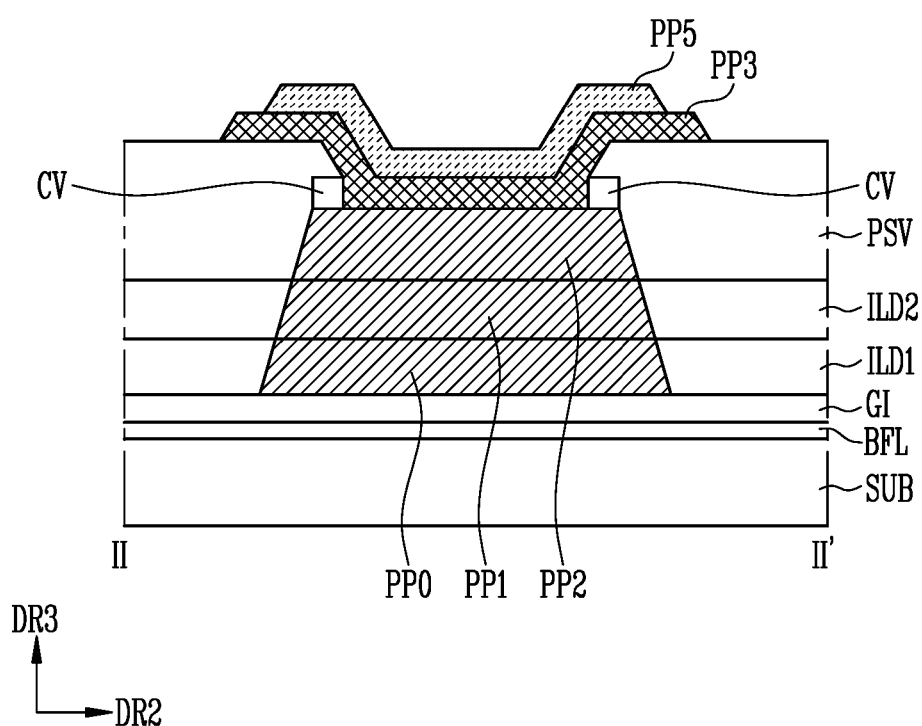

Subsequently, referring to FIG. 24, the third pad pattern PP3 may be deposited on the entire surface of the pad area PDA, and then at least a portion of the deposited third pad pattern PP3 may be removed. As described above, the third pad pattern PP3 may be disposed to be electrically connected to the second pad pattern PP2. The third pad pattern PP3 may be located, and the cavity CV may be provided. As described above with reference to FIG. 23, the gap 302 may be provided when the fourth pad pattern PP4 is removed during the etching process of the first base electrode layer BELT1, and the cavity CV may be formed when the third pad pattern PP3 is disposed on the second pad pattern PP2. Subsequently, the fifth pad pattern PP5 may be patterned on the third pad pattern PP3. As described above, the fifth pad pattern PP5 may be arranged to be electrically connected to the third pad pattern PP3.

Hereinafter, a manufacturing method of the display device in accordance with another embodiment of the present disclosure will be described with reference to FIGS. 25 to 37.

FIGS. 25 to 37 are sectional process views illustrating a manufacturing method of the display device in accordance with another embodiment of the present disclosure.

FIGS. 25, 26, 28, 30, 32, 34, and 36 are sectional process views illustrating a manufacturing process of a pad PAD included in the display device in accordance with another embodiment of the present disclosure taken along the line II-II' of FIG. 3. FIGS. 27, 29, 31, 33, and 35 are sectional process views illustrating processes performed in the display area DA and taken along the line III-III' of FIG. 8.

Figure 25:
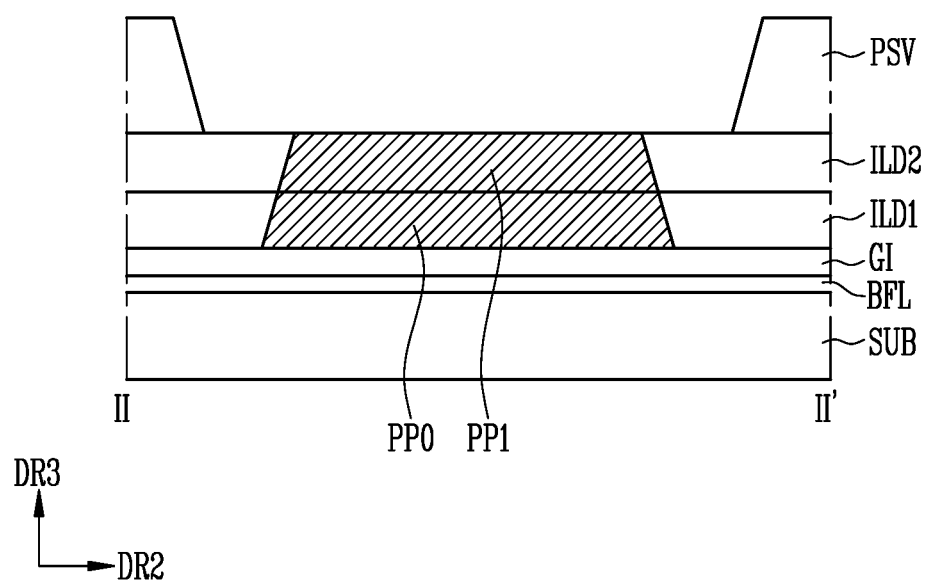
FIGS. 25 to 37 are sectional process views illustrating a manufacturing method of a display device in accordance with another embodiment of the present disclosure.

First, referring to FIG. 25, a buffer layer BFL may be located on a substrate SUB, a gate insulating layer GI may be located on the buffer layer BFL, a first interlayer insulating layer ILD1 may be located on the gate insulating layer GI, and a second interlayer insulating layer ILD2 may be located on the first interlayer insulating layer ILD1. A zeroth pad pattern PP0 may be arranged on the gate insulating layer GI, and a first pad pattern PP1 may be arranged on the zeroth pad pattern PP0.

Subsequently, a protective layer PSV may be arranged on the second interlayer insulating layer ILD2. After the protective layer PSV is deposited on the entire surface of the pad area PDA, at least a portion of the protective layer PSV may be removed such that the first pad pattern PP1 is exposed to the outside.

Figure 26:
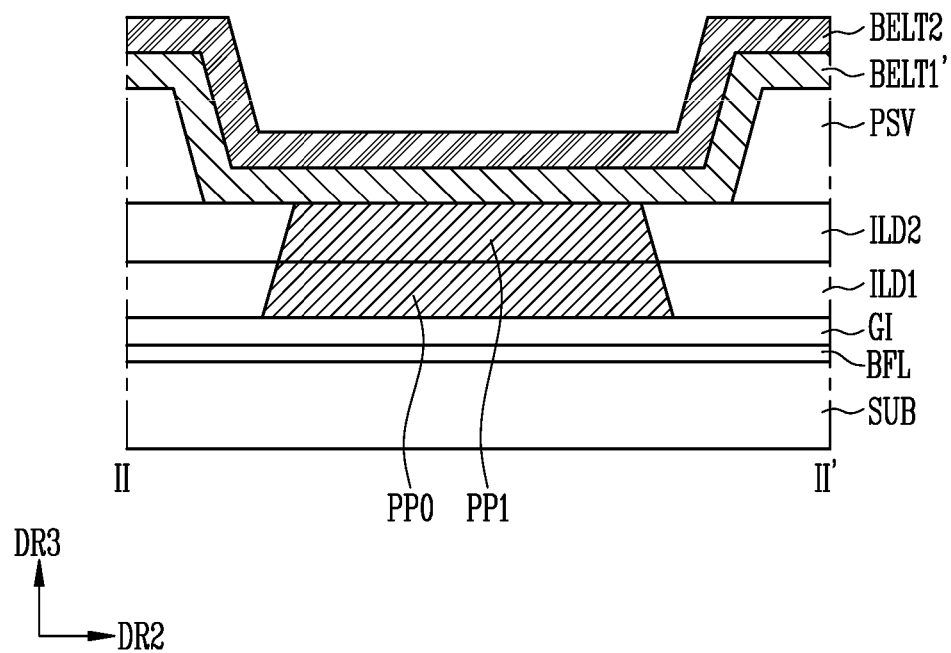
Figure 27:
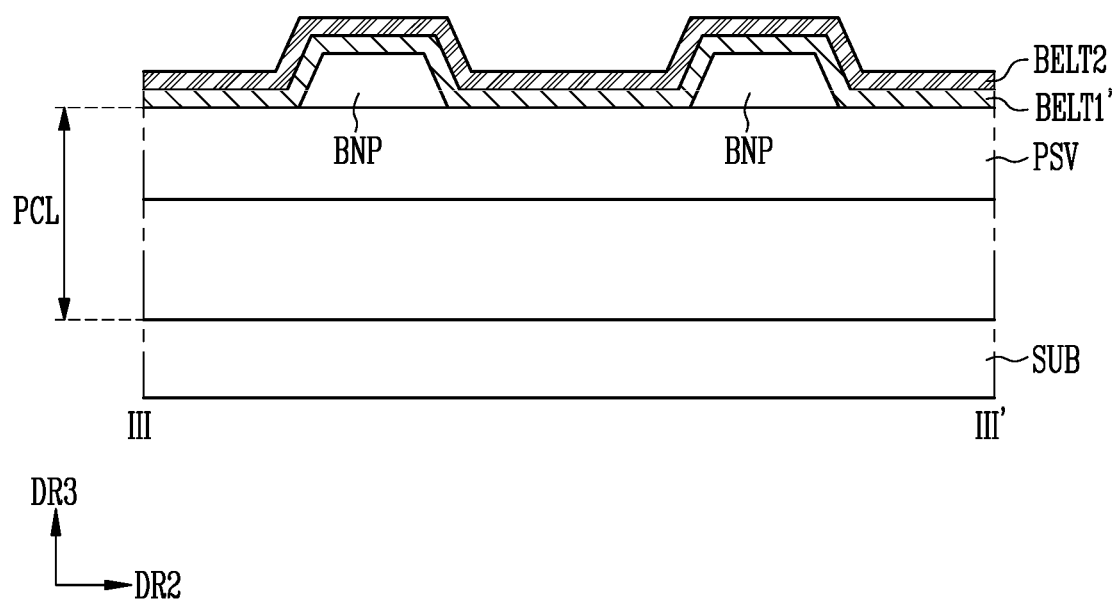

Referring to FIGS. 26 and 27, a first base electrode layer BELT1' and a second base electrode layer BELT2 may be formed. The first base electrode layer BELT1' may be deposited on the protective layer PSV, and the second base electrode layer BELT2 may be deposited on the first base electrode layer BELT1'. FIG. 26 is a view illustrating a partial section of the pad area PDA, when the first base electrode layer BELT1' and the second bas electrode layer BELT2 are formed. FIG. 27 is a view illustrating a partial section of the display area DA when the first base electrode layer BELT1' and the second bas electrode layer BELT2 are formed.

First, referring to FIG. 26, the first base electrode layer BELT1' may be deposited on the entire surface of the pad area PDA. The first base electrode layer BELT1' may be deposited to cover the protective layer PSV and the first pad pattern PP1. Subsequently, the second base electrode layer BELT2 may be deposited on the entire surface of the pad area PDA to cover the first base electrode layer BELT1'.

Next, referring to FIG. 27, the first base electrode layer BELT1' may be deposited on the entire surface of the display are DA. The first base electrode layer BELT1' may be deposited to cover the protective layer PSV and the bank pattern BNP. Subsequently, the second base electrode layer BELT2 may be deposited on the entire surface of the display area DA to cover the first base electrode layer BELT1'.

Figure 28:
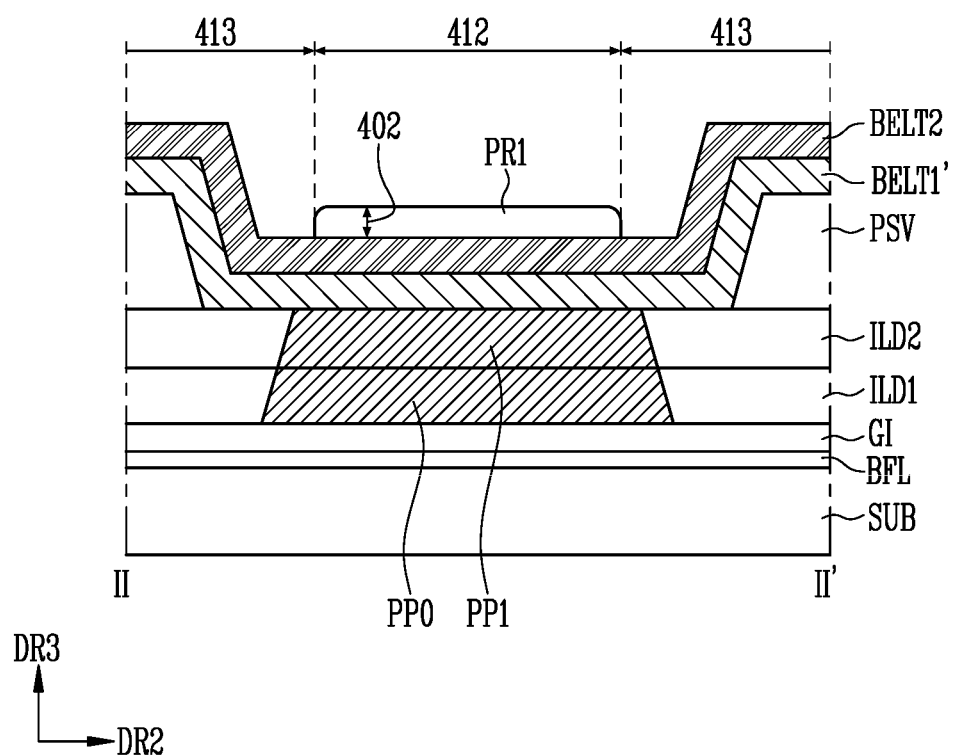
Figure 29:
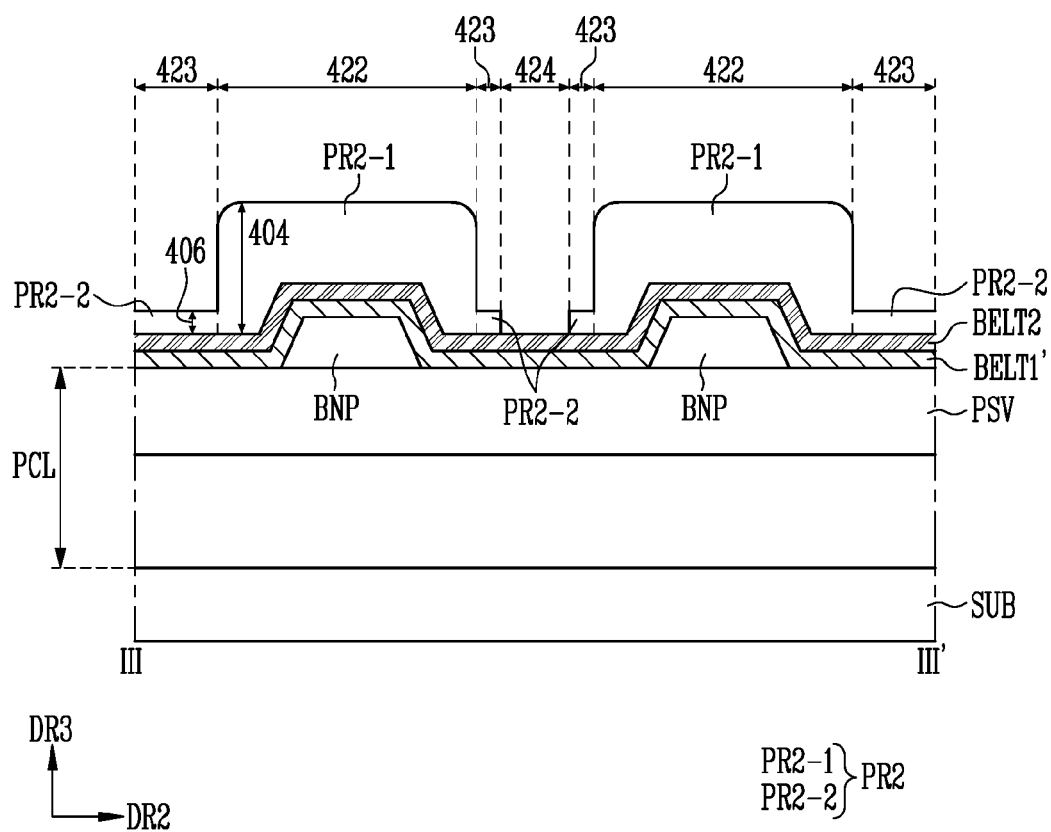

Referring to FIGS. 28 and 29, a first photoresist layer PR1 may be formed in the pad area PDA, and a second photoresist layer PR2 may be formed in the display area DA. The first photoresist layer PR1 and the second photoresist layer PR2 may include a photoresistive material.

The pad area PDA may include a (1-1)th area 412 in which the first photoresist layer PR1 is formed and a (1-2)th area 413 in which the first photoresist layer PR1 is not formed. The first photoresist layer PR1 may be formed at a position at where a second pad pattern PP2 is to be provided in a subsequent process. In an example, at least a portion of the first photoresist PR1 may be arranged to overlap the first pad pattern PP1 when viewed on a plane.

In the display area DA, the second photoresist layer PR2 may be formed at a position at where a first electrode ELT1' and a second electrode ELT2' are to be provided in a subsequent process. In an example, at least a portion of the second photoresist layer PR2 may be arranged on the bank pattern BNP.

The display area DA may include a (2-1)th area 422, a (2-2)th area 423, and a (2-3)th area 424. The second photoresist layer PR2 may include a (2-1)th photoresist layer PR2-1 and a (2-2)th photoresist layer PR2-2. The (2-1)th photoresist layer PR2-1 may be arranged in the (2-1)th area 422. The (2-1)th area 422 may be an area at where the first electrode ELT1' and a third electrode ELT3 overlap each other or an area at where the second electrode ELT2' and a fourth electrode ELT4 overlap each other as a subsequent process is performed. The (2-2)th photoresist layer PR2-2 may be arranged in the (2-2)th area 423. The (2-2)th area 423 may be an area at where the first electrode ELT1' or the second electrode ELT2' is provided as a subsequent process is performed and the third electrode ELT3 or the fourth electrode ELT4 is not arranged.

A thickness of the first photoresist layer PR1 and a thickness of the (2-1)th photoresist layer PR2-1 may be different from each other. The first photoresist layer PR1 may have a first thickness 402, and the (2-1)th photoresist layer PR2-1 may have a (2-1)th thickness 404. The (2-1)th thickness 404 may be a thickest thickness of the (2-1)th photoresist layer PR2-1 with respect to the protective layer PSV or the substrate SUB. The (2-1)th thickness 404 may be greater than the first thickness 402. In an example, the first thickness 402 may be in a range of about 6000 Å to about 8000 Å. The (2-1)th thickness 404 may be in a range of about 20000 Å to about 26000 Å.

A thickness of the (2-1)th photoresist layer PR2-1 and a thickness of the (2-2)th photoresist layer PR2-2 may be different from each other. The (2-2)th photoresist layer PR2-2 may have a (2-2)th thickness 406. The (2-1)th thickness 404 may be greater than the (2-2)th thickness 406. In an example, the (2-2)th thickness 406 may be in a range of about 6000 Å to about 8000 Å.

Subsequently, an etching mask for performing an etching process may be provided by performing exposure and development processes on the first and second photoresist layers PR1 and PR2. A halftone mask or a slit mask may be used in the exposure process, but the present disclosure is not limited to a specific example.

Figure 30:
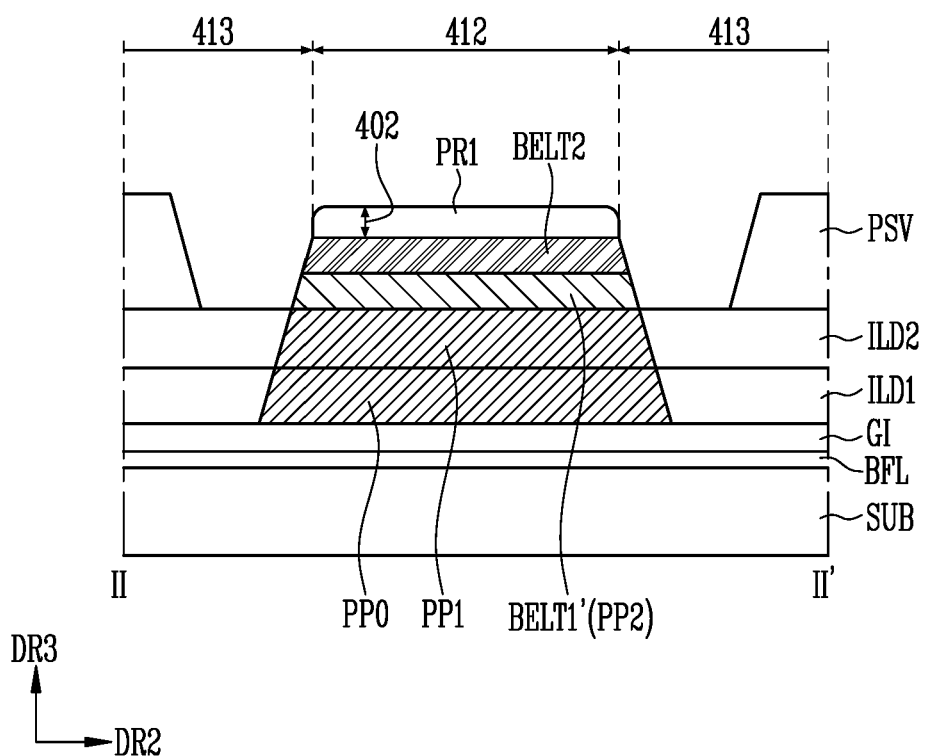
Figure 31:
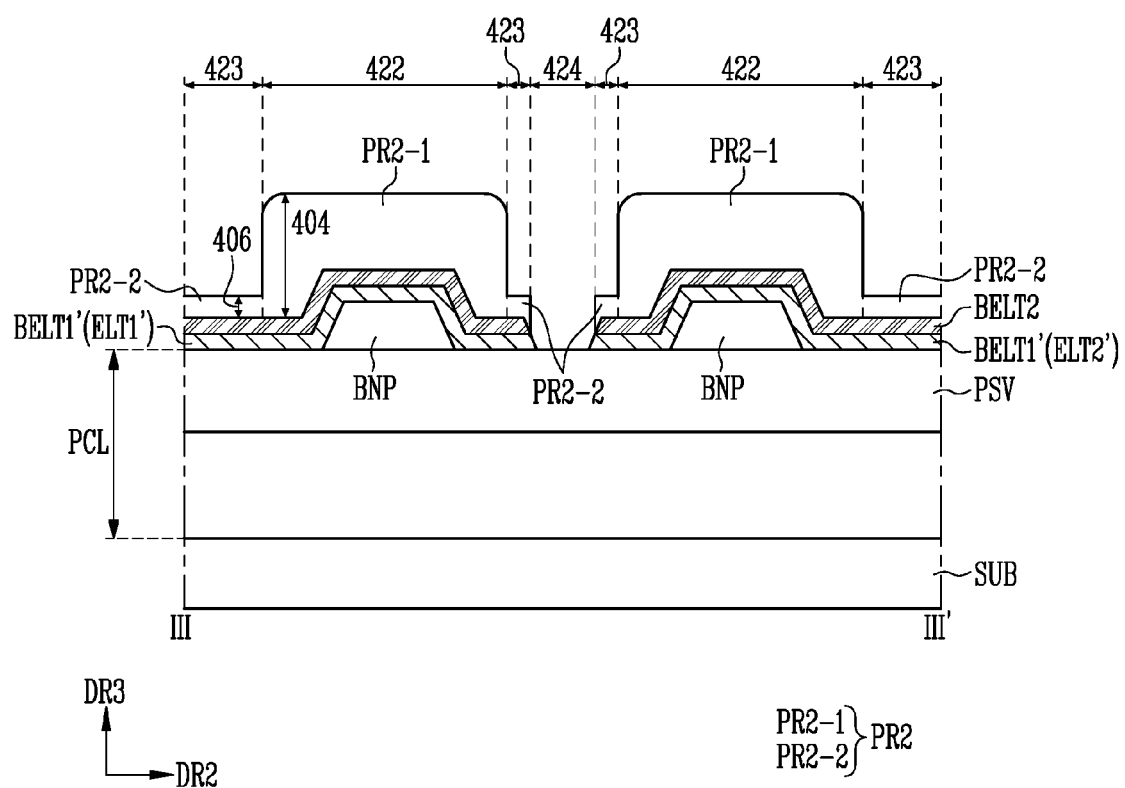

Referring to FIGS. 30 and 31, at least a portion of each of the first base electrode layer BELT1' and the second base electrode layer BELT2 may be removed.

In this process, at least a portion of each of the first base electrode layer BELT1' and the second base electrode layer BELT2 may be removed through a first etching process. The first etching process may be a wet etching process, but the present disclosure is not limited thereto. A first etchant for the first base electrode layer BELT1' and the second base electrode layer BELT2 may be applied to the first etching process. The first etchant may include a material which satisfies selectivity and uniformity with respect to the first base electrode layer BELT1' and the second base electrode layer BELT2.

In the pad area PDA, a portion of each of the first base electrode layer BELT1' and the second base electrode layer BELT2, which does not overlap with the first photoresist layer PR1, may be removed. In an example, the first base electrode layer BELT1' and the second base electrode layer BELT2 that are arranged in the (1-2)th area 413 may be removed, and the first base electrode layer BELT1' and the second base electrode layer BELT2 that are arranged in the (1-1)th area 412 may not be removed. A portion of the first base electrode layer BELT1' arranged in the pad area PDA may be removed so that the second pad pattern PP2 is provided.

In the display area DA, the first base electrode layer BELT1' and the second base electrode layer BELT2 that do not overlap with the second photoresist layer PR2 may be removed. In an example, the first base electrode layer BELT1' and the second base electrode layer BELT2 that are arranged in the (2-3)th area 424 may be removed, and the first base electrode layer BELT1' and the second base electrode layer BELT2 that are arranged in the (2-1)th area 422 or the (2-2)th area 423 may not be removed. A portion of the first base electrode layer BELT1' arranged in the display area DA may be removed so that the first electrode ELT1' and the second electrode ELT2' are provided.

Figure 32:
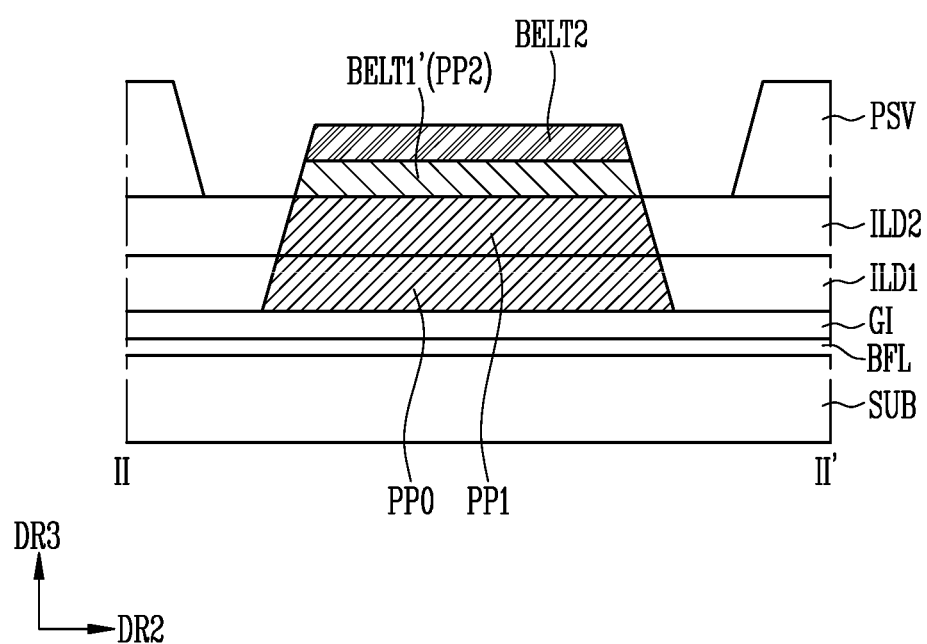
Figure 33:
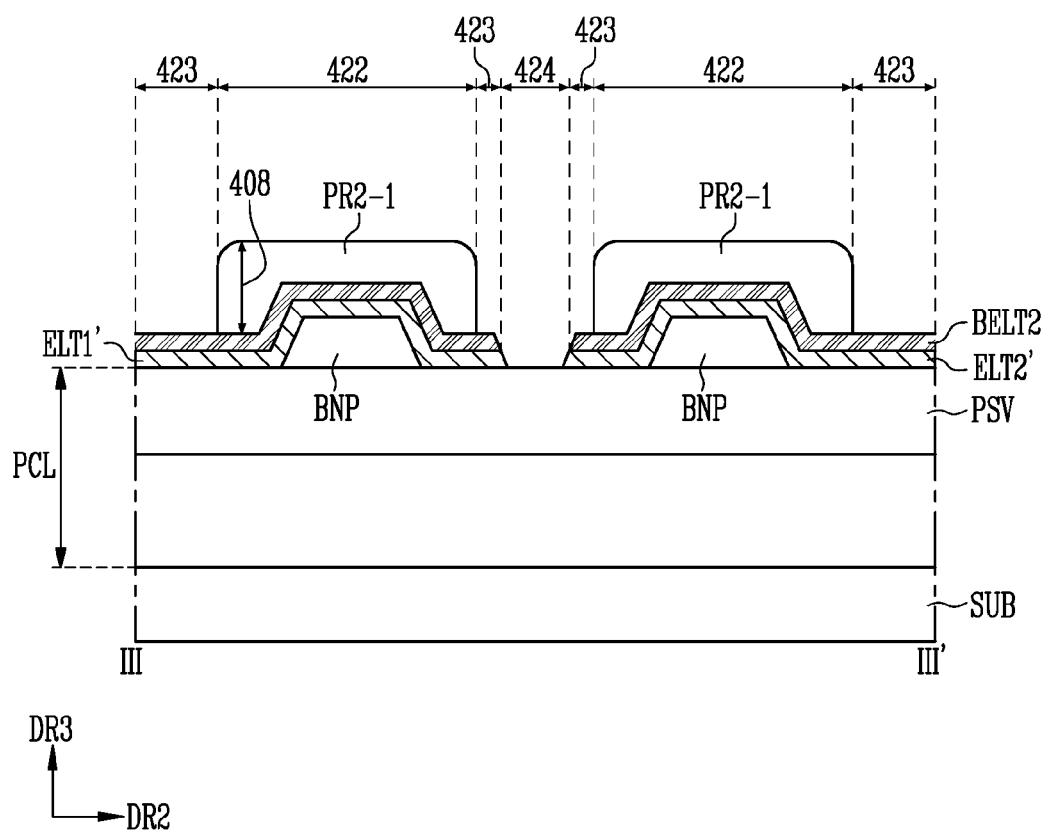

Referring to FIGS. 32 and 33, at least a portion of each of the first photoresist layer PR1 and the second photoresist layer PR2 may be removed. The first photoresist layer PR1 and the second photoresist layer PR2 may be removed through a second etching process. The second etching process may be an etch-back process.

In the pad area PDA, the first photoresist layer PR1 may be removed through the etch-back process so that a top surface of the second base electrode layer BELT2 is exposed to the outside.

In the display area DA, a portion of the second photoresist layer PR2 may be removed through the etch-back process, and at least a portion of the second photoresist layer PR2 may still be present.

A portion of the (2-1)th photoresist layer PR2-1 may be removed through the etch-back process, but at least a portion of the (2-1)th photoresist layer PR2-1 may be located on the second base electrode layer BELT2 arranged in the (2-1)th area 422. After this process, the (2-1)th photoresist layer PR2-1 may have a (2-3)th thickness 408. The (2-3)th thickness 408 may be smaller than the (2-1)th thickness 404.

The (2-2)th photoresist layer PR2-2 may be removed through the etch-back process so that the top surface of the second base electrode layer BELT2 arranged in the (2-2)th area 423 is exposed to the outside.

The second photoresist layer PR2 may be arranged in the (2-1)th area 422. After this process, the second photoresist layer PR2 may have a third thickness 408. The third thickness 408 may be smaller than the second thickness 404 described above with reference to FIG. 29.

Figure 34:
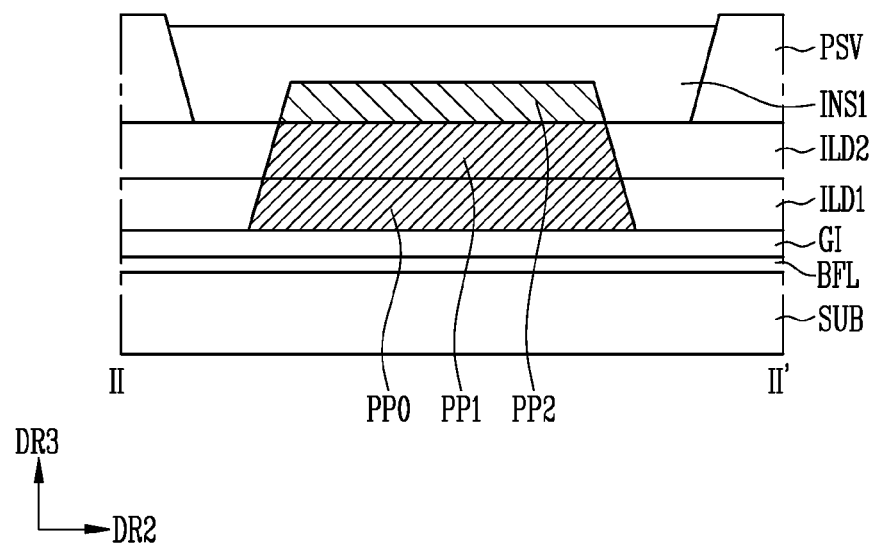
Figure 35:
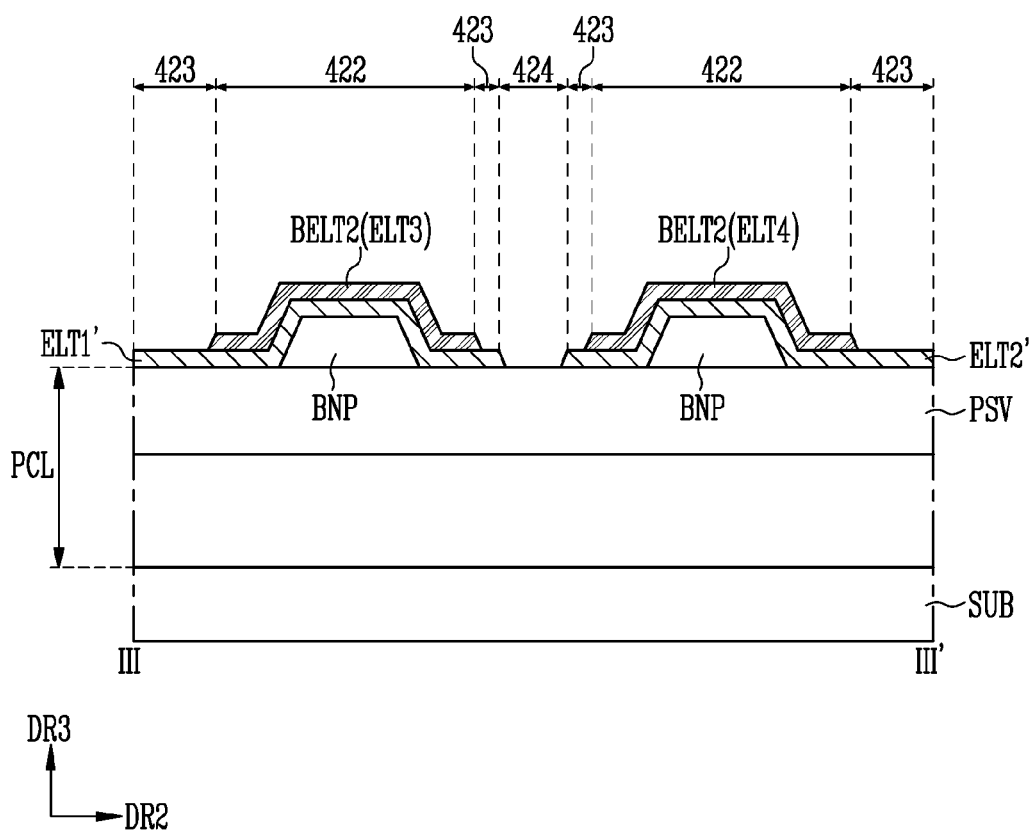

Referring to FIGS. 34 and 35, at least a portion of the second base electrode layer BELT2 may be removed. The second base electrode layer BELT2 may be removed through a third etching process. The third etching process may be a wet etching process or a dry etching process, but the present disclosure is not limited to a specific example. A first insulating layer INS1 may be formed on the second interlayer insulating layer ILD2 and the second pad pattern PP2.

In the pad area PDA, the entire second base electrode layer BELT2 may be removed. Accordingly, a top surface of the second pad pattern PP2 may be exposed to the outside.

In the display area DA, the second base electrode BELT2 arranged in the (2-1)th area 422 may not be removed, and the second base electrode BELT2 arranged in the (2-2)th area 423 may be removed. When this process is performed, the third electrode ELT3 and the fourth electrode ELT4 may be provided.

Figure 36:
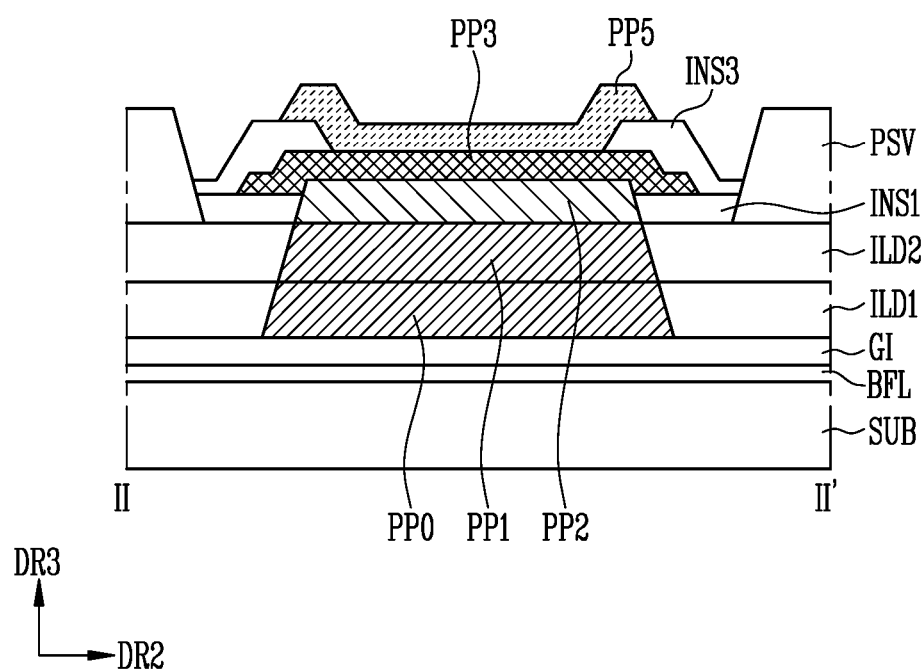

Referring to FIG. 36, the first insulating layer INS1 may be patterned such that at least a portion of the second pad pattern PP2 is exposed, and the third pad pattern PP3 may be patterned to be electrically connected to the second pad pattern PP2. Subsequently, the third insulating layer INS3 may be patterned such that at least a portion of the third pad pattern PP3 is exposed, and the fifth pad pattern PP5 may be patterned to be electrically connected to the third pad pattern PP3.

Figure 37:
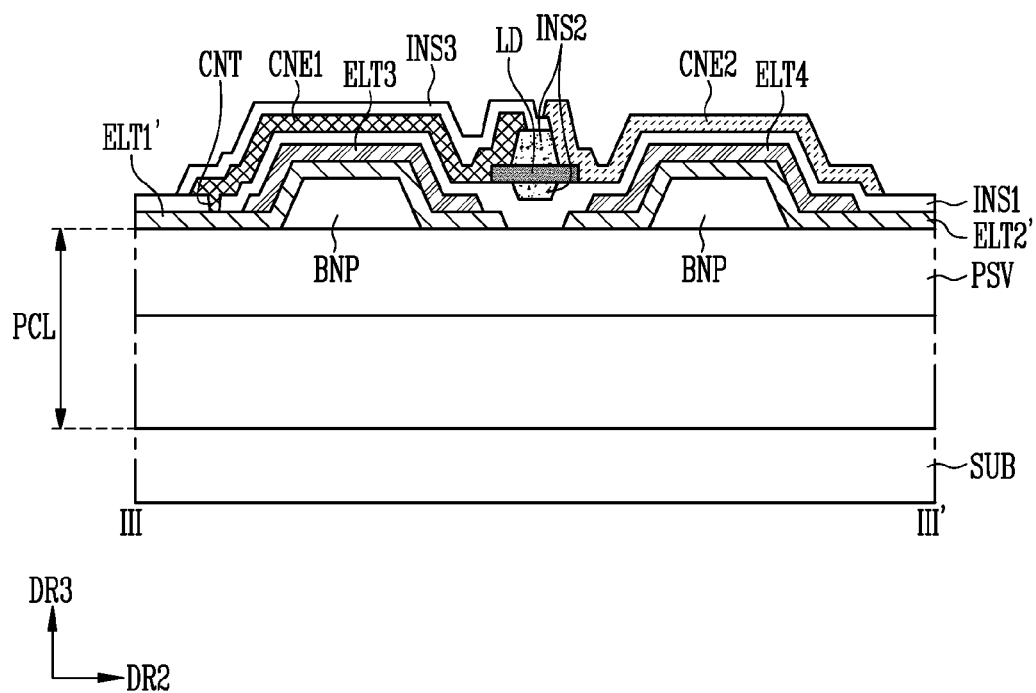

Referring to FIG. 37, the first insulating layer INS1 may be patterned, the light emitting element LD may be arranged on the first insulating layer INS1, and the second insulating layer INS2 may be formed on the light emitting element LD. Subsequently, a first contact electrode CNE1 is patterned to be electrically connected to one end of the light emitting element LD, the third insulating layer INS3 may be formed, and then a second contact electrode CNE2 may be patterned to be electrically connected to the other end of the light emitting element LD. At least a portion of the first contact electrode CNE1 may be electrically connected to the first electrode ELT1' through the contact part CNT. The first contact electrode CNE1 may contact the first electrode ELT1' through the contact part CNT. The first contact electrode CNE1 and the third pad pattern PP3 may be patterned through the same process, and the second contact electrode CNE2 and the fifth pad pattern PP5 may be patterned through the same process.

Hereinafter, the improved electrical reliability of the display device including the pad PAD in accordance with the present disclosure will be described in detail by comparing pads PAD in accordance with embodiments with pads in accordance with comparative examples.

Embodiments

Pads PAD in accordance with embodiments 1 to 15 were manufactured as shown in the following Table 1.

The pads PAD in accordance with embodiments 1 to 15 do not include an electrode component (e.g., an electrode component patterned at the same time as the component acting as the second reflective electrode) including aluminum (Al). Accordingly, the pads PAD in accordance with embodiments 1 to 15 were manufactured to not include aluminum (Al) or an alloy thereof.

An initial resistance value of the pads PAD in accordance with embodiments 1 to 15 was measured and a resistance value was measured after various time had elapsed. Resistance values of the pads PAD in accordance with embodiments 1 to 15 were measured based on a case where the display device including the pad PAD is normally driven under a peripheral temperature of 50°. The case where the display device is normally driven is an operation state in which light is emitted from the pixel of the display device.

The data in the following Table 1 represents a resistance value according to lapsed time for each embodiment. Each resistance value is expressed by a unit of ohm (Ω).

A resistance variation of the following Table 1 was obtained by calculating a difference between a resistance value of each of the pads in accordance with the embodiments and an initial resistance value of each of the pads in accordance with the embodiments after 1000 hr had elapsed.

TABLE 1

| Classification | 0 hr | 120 hr | 168 hr | 308 hr | 500 hr | 1000 hr | Resistance variation |
|---|---|---|---|---|---|---|---|
| Embodiment 1 | 10.3 | 12.3 | 12.4 | 12.5 | 12.8 | 14.8 | 4.5 |
| Embodiment 2 | 10.6 | 12.6 | 12.9 | 12.9 | 13.2 | 15.2 | 4.6 |
| Embodiment 3 | 10.7 | 14.7 | 15.7 | 15.7 | 15.9 | 16 | 5.3 |
| Embodiment 4 | 10.9 | 12.9 | 13 | 13 | 13.1 | 13.2 | 2.3 |
| Embodiment 5 | 10.9 | 12.9 | 13 | 13 | 13.1 | 15.1 | 4.2 |
| Embodiment 6 | 11.2 | 12.2 | 13.3 | 13.3 | 13.5 | 15.5 | 4.3 |
| Embodiment 7 | 11.8 | 12.8 | 13.9 | 13.9 | 14.1 | 16.1 | 4.3 |
| Embodiment 8 | 11.8 | 13.8 | 13.9 | 13.9 | 14.1 | 17.1 | 5.3 |
| Embodiment 9 | 11.8 | 13.8 | 14.1 | 14.2 | 14.4 | 17.4 | 5.6 |
| Embodiment 10 | 12.1 | 13.1 | 14.2 | 14.2 | 14.3 | 17.3 | 5.2 |
| Embodiment 11 | 12.3 | 14.3 | 14.4 | 14.5 | 14.7 | 16.7 | 4.4 |
| Embodiment 12 | 12.3 | 14.3 | 14.6 | 14.6 | 14.8 | 16.8 | 4.5 |
| Embodiment 13 | 12.4 | 15.4 | 16.4 | 16.4 | 16.6 | 16.7 | 4.3 |
| Embodiment 14 | 12.9 | 13.9 | 15 | 15.1 | 15.4 | 15.5 | 2.6 |
| Embodiment 15 | 13.2 | 15.2 | 15.5 | 15.6 | 15.8 | 17.8 | 4.6 |
| Average value | 11.68 | 13.61 | 14.15 | 14.19 | 14.39 | 16.08 | 4.4 |
| Standard deviation | 0.88 | 1.02 | 1.15 | 1.15 | 1.16 | 1.22 | 0.91 |

Comparative Examples

Pads in accordance with comparative examples 1 to 15 were manufactured as shown in the following Table 2.

Each of the pads in accordance with comparative examples 1 to 15 includes an electrode component including aluminum (Al). The electrode component located at an uppermost portion of each of the pads in accordance with comparative examples 1 to 15 was manufactured to include aluminum (Al). The pads in accordance with comparative examples 1 to 15 are different from the pads PAD in accordance with embodiments 1 to 15 in that each of the pads in accordance with comparative examples 1 to 15 includes an electrode layer including aluminum (Al).

An initial resistance value of the pads in accordance with comparative examples 1 to 15 was measured, and a resistance value was measured after various elapsed times. Resistance values of the pads in accordance with comparative examples 1 to 15 were measured based on a case where a display device including the pad is normally driven under a peripheral temperature of 50° C. The case where the display device is normally driven is an operation state in which light is emitted from the pixel of the display device.

The data in the following Table 2 represents a resistance value according to lapsed time for each comparative example. Each resistance value is expressed by a unit of ohm (Ω).

A resistance variation of the following Table 2 was obtained by calculating a difference between a resistance value of each of the pads in accordance with comparative examples and an initial resistance value of each of the pads in accordance with comparative examples after 1000 hr had elapsed.

TABLE 2

| Classification | 0 hr | 120 hr | 168 hr | 308 hr | 500 hr | 1000 hr | Resistance variation |
|---|---|---|---|---|---|---|---|
| Comparative example 1 | 9.7 | 19.8 | 35.4 | 36.3 | 76.8 | 96.3 | 86.6 |
| Comparative example 2 | 10.7 | 12.6 | 13.9 | 15.2 | 20.3 | 78 | 67.3 |

TABLE 2-continued

| Classification | 0 hr | 120 hr | 168 hr | 308 hr | 500 hr | 1000 hr | Resistance variation |
|---|---|---|---|---|---|---|---|
| Comparative example 3 | 10.9 | 14 | 14.6 | 16.3 | 23.8 | 58.2 | 47.3 |
| Comparative example 4 | 11.5 | 13.3 | 15.4 | 17.8 | 29.5 | 120.2 | 108.7 |
| Comparative example 5 | 11.6 | 21.9 | 24.9 | 35.6 | 57.7 | 83.5 | 71.9 |
| Comparative example 6 | 11.9 | 17.4 | 19.2 | 23.2 | 35.9 | 69.7 | 57.8 |
| Comparative example 7 | 13.3 | 25.5 | 25.1 | 28.8 | 34.7 | 83 | 69.7 |
| Comparative example 8 | 15.2 | 22.4 | 24.5 | 29.3 | 44.8 | 166.5 | 151.3 |
| Comparative example 9 | 16.4 | 36.7 | 44.5 | 59.2 | 96.4 | 112.3 | 95.9 |
| Comparative example 10 | 16.7 | 18.7 | 20.3 | 23.4 | 35.6 | 86 | 69.3 |
| Comparative example 11 | 17 | 20.9 | 24.6 | 29.4 | 47.2 | 89.8 | 72.8 |
| Comparative example 12 | 17 | 19.7 | 20.8 | 23.4 | 35.8 | 82.5 | 65.5 |
| Comparative example 13 | 19.9 | 22.3 | 23.4 | 25.5 | 36.4 | 115.6 | 95.7 |
| Comparative example 14 | 29.8 | 34.6 | 36.6 | 42.5 | 62.8 | 175.9 | 146.1 |
| Comparative example 15 | 33 | 39.9 | 42.9 | 45.5 | 61.8 | 145.1 | 112.1 |
| Average value | 16.31 | 22.65 | 25.74 | 30.09 | 46.63 | 104.17 | 87.87 |
| Standard deviation | 6.83 | 8.34 | 9.77 | 12.05 | 20.90 | 34.94 | 30.70 |

Referring to Tables 1 and 2, the resistance values of the pads PAD in accordance with embodiments 1 to 15 after 1000 hr had elapsed increased by an average of 4.4Ω with respect to the initial resistance value, and the resistance values of the pads in accordance with comparative examples 1 to 15 after 1000 hr had elapsed increased by an average of 87.87Ω with respect to the initial resistance value.

Also, referring to Tables 1 and 2, the resistance variations of the pads PAD in accordance with embodiments 1 to 15 after 1000 hr had elapsed have a standard deviation of 0.91, and the resistance variations of the pads in accordance with comparative examples 1 to 15 after 1000 hr had elapsed have a standard deviation of 30.70.

The pads PAD in accordance with embodiments of the present disclosure have a variation in resistance value that is smaller than that of the pads in accordance with the comparative examples even after substantial driving time had elapsed, and a predicted range of the resistance variations is limited within a narrow numerical range. Thus, it can be reasonably predicted that resistance variations of the pads PAD in accordance with the embodiments can occur within a specific numerical range while being maintained at low numerical values. Consequently, distortion of electrical signals in the pads PAD in accordance with the embodiments and devices including the same can be prevented or substantially prevented, and the electrical reliability of the pads PAD in accordance with the embodiments and the devices including the same can be ensured.

In accordance with the present disclosure, there may be provided a display device that provides improved electrical reliability and prevents distortion of an electrical signal and a manufacturing method thereof.

Example embodiments have been disclosed herein, and although specific terms are employed, they are used and are to be interpreted in a generic and descriptive sense and not for purpose of limitation. In some instances, as would be apparent to one of ordinary skill in the art as of the filing of the present application, features, characteristics, and/or elements described in connection with one embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims and their equivalents.

What is claimed is:

1. A display device having a pad area and a display area, the display device comprising:
    a substrate;
    a pad structure on a surface of the substrate in the pad area, the pad structure comprising a first pad pattern, a second pad pattern on an upper surface of the first pad pattern, and a third pad pattern on an upper surface of the second pad pattern; and
    a display element part on the substrate in the display area, the display element part comprising a light emitting element configured to emit light in a display direction,
    wherein the upper surface of the second pad pattern has a first area and a second area,
    wherein the upper surface of the second pad pattern and the third pad pattern do not contact each other in the first area, and
    wherein the upper surface of the second pad pattern and the third pad pattern contact each other in the second area.

2. The display device of claim 1, wherein the display element part comprises a bank pattern having a shape protruding in the display direction and an arranged electrode on the bank pattern,
    wherein the arranged electrode is in the display area, and
    wherein the arranged electrode is not in the pad area.

3. The display device of claim 2, wherein the arranged electrode comprises aluminum.

4. The display device of claim 1, wherein the pad structure further comprises a fourth pad pattern on the second pad pattern in the first area,
    wherein the second pad pattern, the third pad pattern, and the fourth pad pattern overlap each other in the first area, and
    wherein the second pad pattern and the third pad pattern overlap each other in the second area.

5. The display device of claim 1, wherein the pad structure further comprises a cavity on the second pad pattern in the first area.

6. The display device of claim 1, wherein the display element part further comprises a contact electrode electrically connected to the light emitting element, and
    wherein the contact electrode and the third pad pattern comprise the same material.

7. A display device having a pad area and a display area, the display device comprising:
    a substrate;
    a pad structure on the substrate in the pad area, the pad structure comprising a first pad pattern, a second pad pattern on the first pad pattern, and a third pad pattern on the second pad pattern; and
    a display element part on the substrate in the display area, the display element part comprising a first arranged electrode, a second arranged electrode on the first arranged electrode, and a light emitting element,
    wherein the third pad pattern comprises the same material as and is on the same layer as the first arranged electrode.

8. The display device of claim 7, further comprising:
an insulating layer on the second arranged electrode; and
a contact electrode on the insulating layer, the contact electrode being electrically connected to the light emitting element,
wherein the insulating layer has a contact part not overlapping the second arranged electrode when viewed on a plane, and
wherein the contact electrode is connected to the first arranged electrode through the contact part.

9. The display device of claim 8, wherein the third pad pattern and the contact electrode comprise the same material.

10. The display device of claim 7, wherein the first arranged electrode and the second arranged electrode comprise different materials.

11. The display device of claim 7, wherein each of the first pad pattern, the second pad pattern, and the third pad pattern comprises a material different from that of the second arranged electrode.

12. The display device of claim 7, wherein the display element part further comprises a bank having a shape protruding in a display direction of the light emitting element, and
wherein at least a portion of each of the first arranged electrode and the second arranged electrode is on the bank.

* * * * *